US011177318B2

(12) United States Patent
Lim et al.

(10) Patent No.: US 11,177,318 B2
(45) Date of Patent: Nov. 16, 2021

(54) SEMICONDUCTOR PACKAGE AND METHOD OF FORMING THE SAME

(71) Applicant: Agency for Science, Technology and Research, Singapore (SG)

(72) Inventors: Teck Guan Lim, Singapore (SG); Hideaki Fukuzawa, Singapore (SG); Hang Liu, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 16/962,187

(22) PCT Filed: Jan. 28, 2019

(86) PCT No.: PCT/SG2019/050043

§ 371 (c)(1),
(2) Date: Jul. 14, 2020

(87) PCT Pub. No.: WO2019/147189

PCT Pub. Date: Aug. 1, 2019

(65) Prior Publication Data

US 2020/0350363 A1 Nov. 5, 2020

(30) Foreign Application Priority Data

Jan. 29, 2018 (SG) .......................... 10201800726W

(51) Int. Cl.
*H01L 27/22* (2006.01)
*H01L 23/498* (2006.01)
(Continued)

(52) U.S. Cl.
CPC ...... *H01L 27/222* (2013.01); *H01L 23/49827* (2013.01); *H01L 24/16* (2013.01); *H01L 43/02* (2013.01); *H01L 2924/3025* (2013.01)

(58) Field of Classification Search
CPC .. H01L 27/222; H01L 23/49827; H01L 24/17
See application file for complete search history.

(56) References Cited

U.S. PATENT DOCUMENTS 6,601,293 B1 8/2003 Glenn
6,603,193 B2 8/2003 Crane, Jr. et al.
(Continued)

FOREIGN PATENT DOCUMENTS

CN 1681119 A 10/2005
EP 0613610 B1 7/1997
JP 2001284870 A 10/2001

OTHER PUBLICATIONS

Watanabe et al., "A Novel U-shaped Magnetic Shield for Perpendicular MRAM," 2012 IEEE 62nd Electronic Components and Technology Conference, May 29-Jun. 1, 2012, pp. 1-6.
(Continued)

*Primary Examiner* — Marc Anthony Armand
(74) *Attorney, Agent, or Firm* — Winstead PC

(57) ABSTRACT

Various embodiments may provide a semiconductor package. The semiconductor package may include a substrate including a via hole. The semiconductor package may also include a chip attached to the substrate. The semiconductor package may further include a prefabricated ferromagnetic pin having a first portion held by the via hole, a second portion extending from a first end of the first portion, and a third portion extending from a second end of the first portion opposite the first end. The semiconductor package may also include a first magnetic shield structure attached to or extended from the second portion of the prefabricated ferromagnetic pin. The semiconductor package may further include a second magnetic shield structure attached to or extended from the third portion of the prefabricated ferromagnetic pin, such that at least a portion of the chip is (Continued)

between the first magnetic shield structure and the second magnetic shield structure.

16 Claims, 25 Drawing Sheets

(51) Int. Cl.
*H01L 23/00* (2006.01)
*H01L 43/02* (2006.01)

(56) References Cited

U.S. PATENT DOCUMENTS 6,720,597 B2 4/2004 Janesky et al.
7,489,015 B2 2/2009 Stobbs
8,004,068 B2 8/2011 Tang et al.
8,097,494 B2 1/2012 Tang et al.
8,378,466 B2 2/2013 Chiu et al.
9,070,692 B2 6/2015 Zhou et al.
2004/0012462 A1* 1/2004 Kim .................... H01R 13/719 333/182
2006/0180342 A1* 8/2006 Takaya .................. H05K 1/165 174/256
2006/0289970 A1 12/2006 Gogl et al.
2008/0073747 A1 3/2008 Chao et al.
2009/0201654 A1 8/2009 Simonovich et al.
2012/0187551 A1 7/2012 Kushino et al.
2013/0219714 A1* 8/2013 Ishida .................. H05K 1/0222 29/852
2014/0197505 A1 7/2014 Zhou et al.
2014/0225208 A1 8/2014 Gu et al.
2015/0048465 A1 2/2015 Gu et al.
2016/0293833 A1* 10/2016 Otsuka .................. H01L 27/222
2017/0025471 A1 1/2017 Bhushan et al.
2017/0025601 A1 1/2017 Bhushan et al.
2017/0047507 A1 2/2017 Seo et al.

OTHER PUBLICATIONS

Tom Strothmann, "Characterization of eWLB PoP Structures," International Wafer Level Packaging Conference Proceedings, San Jose, California, Nov. 5-8, 2012, pp. 1-6.
TDK, "Electronics ABC Capacitors, Part 2 "Ceramic Capacitors [1]"," https://www.tdk.com/tech-mag/electronics_primer/5, 2019, pp. 1-7.
Fischer et al., "High Aspect Ratio TSVs Fabricated by Magnetic Self-Assembly of Gold-Coated Nickel Wires," IEEE 62nd Electronic Components and Technology Conference, 2012, pp. 541-547.
International Search Report for International Application No. PCT/SG2019/050043 dated Apr. 18, 2019, pp. 1-4.
Written Opinion of the International Searching Authority for International Application No. PCT/SG2019/050043 dated Apr. 18, 2019, pp. 1-6.

* cited by examiner

FIG. 4C

| | Field strength (Oe) – Z axis | | | | |
|---|---|---|---|---|---|
| Structure (all in mm) | 400 | 600 | 800 | 1000 | 1200 |
| Solid wall of 0.3, inner edge 11.276 | 0.4 | | 68 | | 475 |
| 2R (Via count = 116)<br>Inner Via 15 + Outer Via 16 | 6 | 158 | 368 | 583 | |
| 3R (Via count = 168)<br>Inner Via 14 + 2R | 0.4 | | 72 | 269 | |
| 4R (Via count = 232)<br>3R + Out Via 17 | | | | 94 | 290 |

SEMICONDUCTOR PACKAGE AND METHOD OF FORMING THE SAME

CROSS-REFERENCE TO RELATED APPLICATION

This application claims the benefit of priority of Singapore application No. 10201800726W filed Jan. 29, 2018, the contents of it being hereby incorporated by reference in its entirety for all purposes.

TECHNICAL FIELD

Various aspects of this disclosure relate to a semiconductor device or package. Various aspects of this disclosure relate to a method of forming a semiconductor device or package.

BACKGROUND

Spin Transfer Torque Magnetoresistive Random Access Memory (STT-MRAM) is a non-volatile solid-state memory which is capable of high endurances, fast read/write speeds, and low power consumption. It can be integrated with complementary metal oxide semiconductor (CMOS) access transistors, and is well suited to form embedded cache memory. Due to its non-volatile characteristics, STT-MRAM may help to speed up the power up cycle of the central processing unit (CPU) and reduce power consumption. These features of the MRAM are very attractive for fast-speed, battery operated applications. However, the STT-MRAM data can be affected by external magnetic field and a magnetic shield may be required to protect it.

Passive magnetic shielding including ferromagnetic material may be desirable as it does not need power to operate. The shield helps to redirect the magnetic flux around the MRAM device instead of going through it. For this to happen, a complete path of high permeability provided by the ferromagnetic material is required. In addition, the shield should be of sufficient thickness to avoid saturation of the ferromagnetic material. The magnetic flux may penetrate the shield into the MRAM device inside the shielded area upon saturation.

The simplest shield design is to enclose the MRAM circuit completely. However, this is not possible as there would need to have openings for electrical connections. These openings need to be located as far away from the MRAM devices so that the magnetic flux leakage from the shield is tolerable. Traditionally, a wire bond package is used for the MRAM circuit. Wire bonds are flexible and long, and these allow the shielding to be designed at the chip level. However, as the MRAM circuit becomes more complex, the number of input/output (I/O) ports, as well as the signal speed increase. These lead to the inevitable switching of the wire bond package to the flip chip package for the MRAM circuit.

Flip chip electrical interconnections include solder balls, which are directly bumped into the substrate. The height of the solder balls is limited, and it may not be possible to accommodate the shield in between the chip and the substrate. In addition, the shield below may be required to have an array of openings for the solder ball to go through. The current manufacturing technology is not able to fabricate this array of openings in a cost-effective manner.

SUMMARY

Various embodiments may provide a semiconductor device or a semiconductor package. The semiconductor device or semiconductor package may include a substrate including a via hole. The semiconductor device or semiconductor package may also include a chip attached to the substrate. The semiconductor device or semiconductor package may further include a prefabricated ferromagnetic pin having a first portion held by the via hole, a second portion extending from a first end of the first portion, and a third portion extending from a second end of the first portion opposite the first end. The semiconductor device or semiconductor package may also include a first magnetic shield structure attached to or extended from the second portion of the prefabricated ferromagnetic pin. The semiconductor device or semiconductor package may further include a second magnetic shield structure attached to or extended from the third portion of the prefabricated ferromagnetic pin, such that at least a portion of the chip is between the first magnetic shield structure and the second magnetic shield structure.

Various embodiments may provide a method of forming a semiconductor device or a semiconductor package. The method may include attaching a chip to a substrate including a via hole. The method may also include inserting a first portion of a prefabricated ferromagnetic pin into a via hole so that the first portion is held by the via hole. The prefabricated ferromagnetic pin may include a second portion extending from a first end of the first portion, and a third portion extending from a second end of the first portion opposite the first end. The semiconductor package or device may further include a first magnetic shield structure attached to or extended from the second portion of the prefabricated ferromagnetic pin. The semiconductor package or device may further include a second magnetic shield structure attached to or extended from the third portion of the prefabricated ferromagnetic pin, such that at least a portion of the chip is between the first magnetic shield structure and the second magnetic shield structure.

BRIEF DESCRIPTION OF THE DRAWINGS

The invention will be better understood with reference to the detailed description when considered in conjunction with the non-limiting examples and the accompanying drawings, in which:

FIG. 4C shows a table showing the simulation results of the shielding effectiveness of packages with different number of magnetic vias according to various embodiments.

DETAILED DESCRIPTION

Figure 1A:
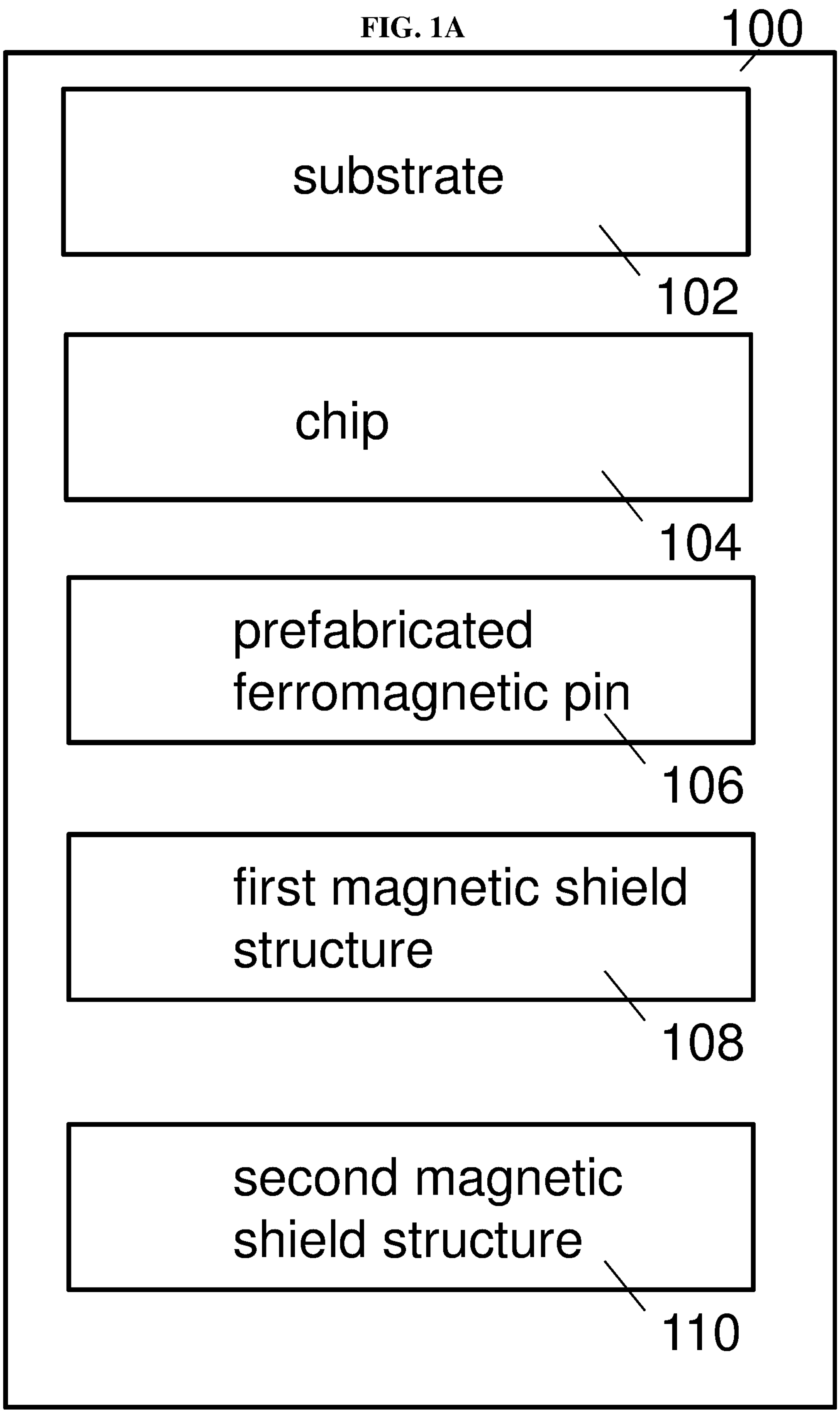
FIG. 1A is a general illustration of a semiconductor device or a semiconductor package according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or structures are analogously valid for the other methods or structures. Similarly, embodiments described in the context of a method are analogously valid for a structure, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers. Further, in the current context, a layer "over" or "on" a side or surface may not necessarily mean that the layer is above a side or surface. A layer "on" a side or surface may mean that the layer is formed in direct contact with the side or surface, and a layer "over" a side or surface may mean that the layer is formed in direct contact with the side or surface or may be separated from the side or surface by one or more intervening layers.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

As highlighted above, the shield may need to enclose the substrate as well for a flip chip package. The shield has to adhere to the overall package size requirements with openings for electrical connections without affecting application performance. Various embodiments may include a ferromagnetic via for the magnetic flux to pass through the substrate. With the magnetic via, an effective and practical shield may be realized. This may enable or extend the applications of the MRAM devices.

Various embodiments may possess advantages over conventional devices or packages as described above. Various embodiments may address or mitigate issues faced by conventional devices or packages.

Various embodiments may be compact and/or may provide an effective and practical shielding. Various embodiments may provide openings for electrical connections to connect to the chip.

Figure 1B:
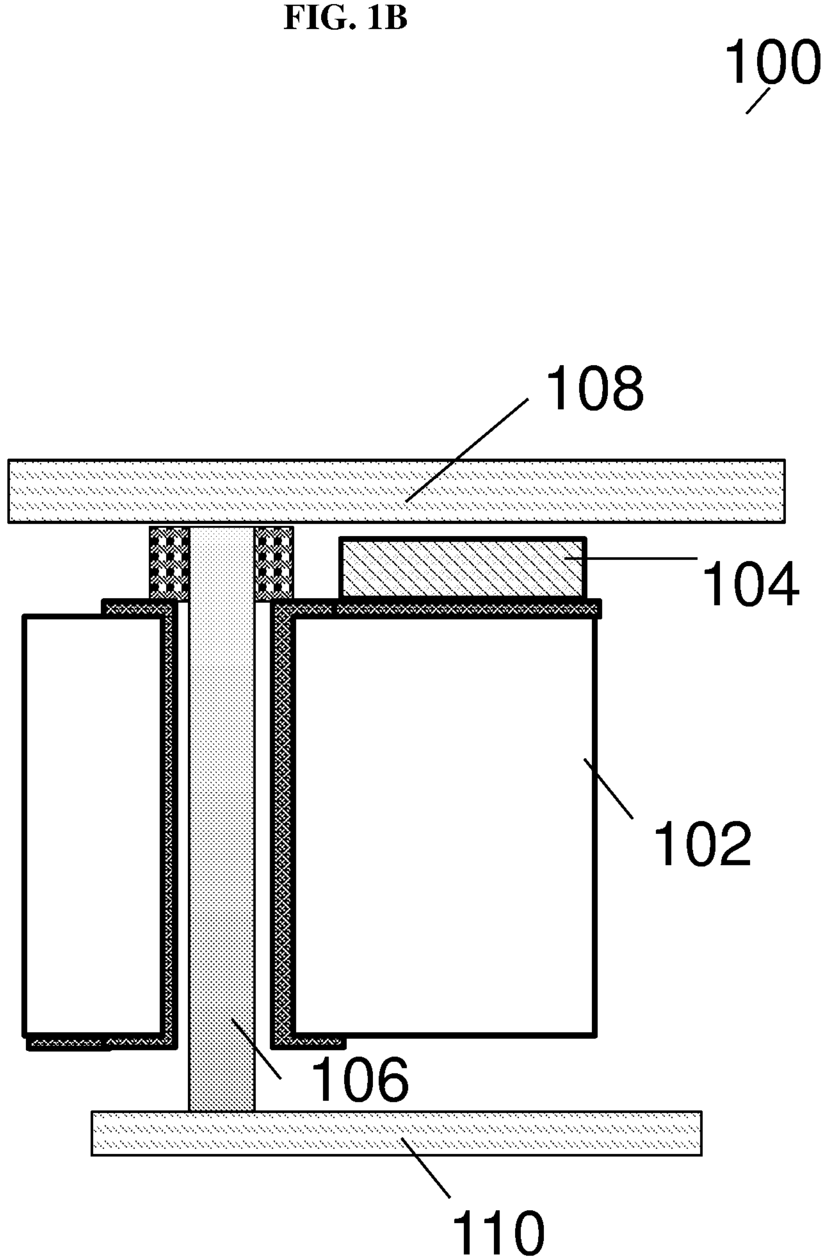
FIG. 1B is a cross-sectional schematic of a part of a semiconductor device or a semiconductor package according to various embodiments.

FIG. 1A is a general illustration of a semiconductor device or a semiconductor package 100 according to various embodiments. FIG. 1B is a cross-sectional schematic of a part of a semiconductor device or a semiconductor package 100 according to various embodiments. The semiconductor device or semiconductor package 100 may include a substrate 102 including a via hole. The semiconductor device or semiconductor package 100 may also include a chip 104 attached to the substrate 102. The semiconductor device or semiconductor package 100 may further include a prefabricated ferromagnetic pin 106 having a first portion held by the via hole, a second portion extending from a first end of the first portion, and a third portion extending from a second end of the first portion opposite the first end. The semiconductor device or semiconductor package 100 may also include a first magnetic shield structure 108 attached to or extended from the second portion of the prefabricated ferromagnetic pin 106. The semiconductor device or semiconductor package 100 may further include a second magnetic shield structure 110 attached to or extended from the third portion of the prefabricated ferromagnetic pin 106, such that at least a portion of the chip is between the first magnetic shield structure 108 and the second magnetic shield structure 110.

In other words, the semiconductor device or semiconductor package 100 may also include a prefabricated ferromagnetic pin 106 held by a via hole of a substrate 102. An end portion of the pin 106 may be attached to or extended from a first magnetic shield structure 108, while a further end portion of the pin 106 opposite the first end may be attached to or extended from a second magnetic shield structure 110.

The first magnetic shield structure 108, the second effective shield structure 110 and the ferromagnetic pin may provide effective magnetic shielding which occupying a small foot print.

In the current context, the prefabricated ferromagnetic pin 106 may mean that the pin 106 is formed before forming the device or package 100.

The first magnetic shield structure 108 may refer to a magnetic shield that is configured to reduce or prevent magnetic field from passing through. Likewise, the second magnetic shield structure 110 may also refer to a magnetic shield that is configured to reduce or prevent magnetic field from passing through. A magnetic shield structure may also be referred to as a magnetic shield.

The via hole may extend from a first surface of the substrate 102 to a second surface of the substrate 102 opposite the first surface.

The second portion may extend out or protrude from the via hole at the first surface of the substrate 102, and/or the third portion may extend out or protrude from the via hole at the second surface of the substrate 102.

In various embodiments, the prefabricated ferromagnetic pin 106 may include a non-ferromagnetic plating layer.

In various embodiments, the semiconductor device or package 100 may include a plating layer on an inner wall of the via hole. The plating layer may include an electrically conductive non-ferromagnetic material, such as copper (Cu) or gold (Au). In various embodiments, the via hole may be fully plated. In various other embodiments, the via hole may be unplated.

In various embodiments, the semiconductor device or package 100 may also include an electrical line in electrical connection with the plating layer. The electrical line may be a ground (GND) line or a power (PWR) line.

In various embodiments, the semiconductor device or package 100 may additionally include a first amount of a ferromagnetic epoxy between the first portion of the prefabricated ferromagnetic pin 106 and the first magnetic shield structure 108 for attaching the first magnetic shield structure 108 to the prefabricated ferromagnetic pin 106.

In various embodiments, the semiconductor device or package 100 may also include a second amount of the ferromagnetic epoxy between the third portion of the prefabricated ferromagnetic pin 106 and the second magnetic shield structure 110 for attaching the second magnetic shield structure 110 to the prefabricated ferromagnetic pin 106.

In various embodiments, the substrate may also include one or more further via holes. In various embodiments, the semiconductor device or package 100 may include one or more further first magnetic shield structures. The semiconductor device or package 100 may also include one or more further prefabricated ferromagnetic pins. Each of the further one or more further prefabricated ferromagnetic pins may be attached to a respective further via hole of the one or more respective via holes. Each of the one or more further prefabricated ferromagnetic pins having a first portion held by a respective further via hole of the one or more further via holes and a second portion extending out from the respective further via hole at the first surface of the substrate, the second portion attached to or extended from a respective further first magnetic shield structure of the one or more further first magnetic shield structures.

In various embodiments, the semiconductor device or package 100 may further include an encapsulation layer including a mold compound. A part of each of the prefabricated ferromagnetic pin and the one or more further prefabricated ferromagnetic pins may be embedded in the mold compound. Each of the prefabricated ferromagnetic pin and the one or more further prefabricated ferromagnetic pins may pass through the encapsulation layer from a first surface to a second surface opposite the first surface. The encapsulation layer may be between the substrate and the first magnetic shield structure 108.

In various embodiments, the via holes and the one or more further via holes may form a staggered arrangement.

The prefabricated ferromagnetic pin and the one or more further prefabricated ferromagnetic pins forms a plurality of (prefabricated) ferromagnetic pins.

In various embodiments, the plurality of ferromagnetic pins may not completely surround the chip. In various other embodiments, the plurality of ferromagnetic pins may surround the chip.

Various embodiments may provide an opening between neighbouring ferromagnetic pins of the plurality of ferromagnetic pins for electrical connections to pass through. The electrical connections may connect to the chip 104, and may carry electrical signal to and/or from the chip 104.

In various embodiments, the prefabricated ferromagnetic pin (and the one or more further prefabricated ferromagnetic pins) may be attached to the first magnetic shield structure before inserting the first portion of the prefabricated ferromagnetic pin into the via hole (and a first portion of each of the one or more further prefabricated ferromagnetic pins into a respective further via hole). In other words, the plurality of ferromagnetic pins and the first magnetic shield structure may be fabricated as a single assembly before inserting the plurality of ferromagnetic pins in the plurality of via holes on the substrate. Accordingly, there may be no need to mold the plurality of ferromagnetic pins to hold them together.

In various embodiments, the prefabricated ferromagnetic pin 106 and the first magnetic shield structure 108 (or the second magnetic shield structure 110) may be formed as a whole. The first magnetic shield structure 108 (or the second magnetic shield structure 110) may extend from the prefabricated ferromagnetic pin 106. The first magnetic structure 108 (or the second magentic structure 110) and the prefabricated ferromagnetic pin 106 may be formed at the same time before being assembled to the substrate 102 to form the semiconductor device or package.

In various embodiments, the semiconductor device or package 100 may additionally include an insulating layer between the first magnetic shield structure 108 and one further first magnetic shield structure of the one or more further first magnetic shield structures such that the first magnetic shield structure, the insulating layer, and the one further first magnetic shield structure form a capacitor. In various embodiments, the insulator layer may include a high-dielectric (high-κ) material, such as hafnium silicate, zirconium silicate, hafnium dioxide, or zirconium dioxide.

In various embodiments, the first magnetic shield structure or the second magnetic shield structure may form a heat sink and/or a heat spreader.

In various embodiments, the chip may include a magnetic random access memory (MRAM) device. The MRAM device may be encapsulated, e.g. in a mold compound. In various embodiments, the chip may include an embedded magnetic random access memory (MRAM) device.

In various embodiments, the MRAM device can be integrated directly with an electrical chip (e.g. a complementary oxide semiconductor (CMOS) chip such as a microcontroller (MCU)). The chip may include the MRAM device as well as one or more electrical devices such as one or more transistors.

Figure 2A:
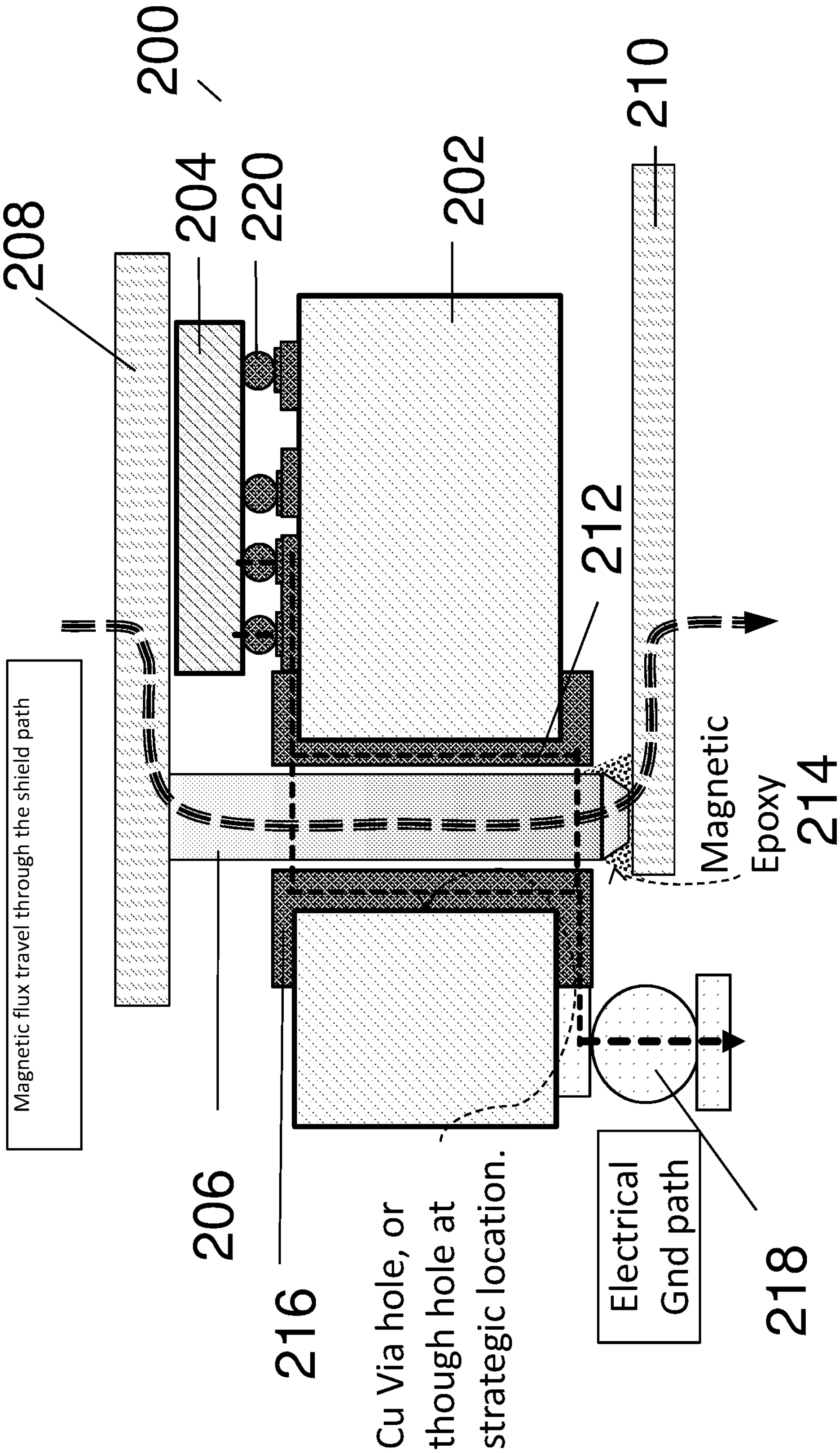
FIG. 2A is a cross-sectional schematic of a part of a semiconductor device or a semiconductor package according to various embodiments.

FIG. 2A is a cross-sectional schematic of a part of a semiconductor device or a semiconductor package 200 according to various embodiments. In order to avoid clutter, not all like elements in the figures have been labelled.

The semiconductor device or semiconductor package 200 may include a substrate 202 including a via hole 212 extending from a first surface of the substrate 202 to a second surface of the substrate 202 opposite the first surface. The semiconductor device or semiconductor package 200 may also include a chip 204, e.g. a MRAM integrated circuit (IC) chip, attached to the substrate 202. The semiconductor device or semiconductor package 200 may further include a prefabricated ferromagnetic pin 206 having a first portion held by the via hole 212, a second portion extending out from the via hole 212 at the first surface of the substrate 202, and a third portion extending out from the via hole 212 at the second surface of the substrate 202. The semiconductor device or semiconductor package 200 may also include a first magnetic shield structure 208 attached to the second portion of the prefabricated ferromagnetic pin 206. The semiconductor device or semiconductor package 200 may further include a second magnetic shield structure 210 attached to the third portion of the prefabricated ferromagnetic pin 206, such that at least a portion of the chip is between the first magnetic shield structure 208 and the second magnetic shield structure 210. The ferromagnetic pin 206 may be or may include a rivet or magnetic epoxy. The substrate 202 may be a printed circuit board (PCB).

The diameter of the magnetic via holes 212 and the diameter of the electrical signal via diameter may be different, depending on the design requirements.

The magnetic pin 206 may be designed to have a tapered end so that it can ease the assembly process. For improved shielding performance and reliability, magnetic epoxy 214 may be used to join the magnetic pin 206 to the shields 208.

The via hole 212 may be fully plated with a suitable metal 216 such as copper. The plated metal 216 may be in contact with a solder bump 218. In addition, the plated metal 216 may be in contact with one or more interconnections 220 joining chip 204 to the substrate 202. An electrical ground path for the chip 204 may be provided through the one or more interconnections 220, the plated metal 216, and the solder bump 218.

For an array of magnetic vias formed with multiple ferromagnetic pins on multiple via holes, a shield in connection with the multiple pins may electrically short all the electrical signals on those vias. Hence, all the electrical vias used may either be at ground or connected to power lines. Various embodiments may utilise existing electrical via holes for the magnetic pins to pass through physically. Dedicated through holes (i.e. unplated through holes) can also be used for the ferromagnetic pins. This may not be desirable in some situations as it increases the footprint of the substrate or PCB.

Figure 2B:
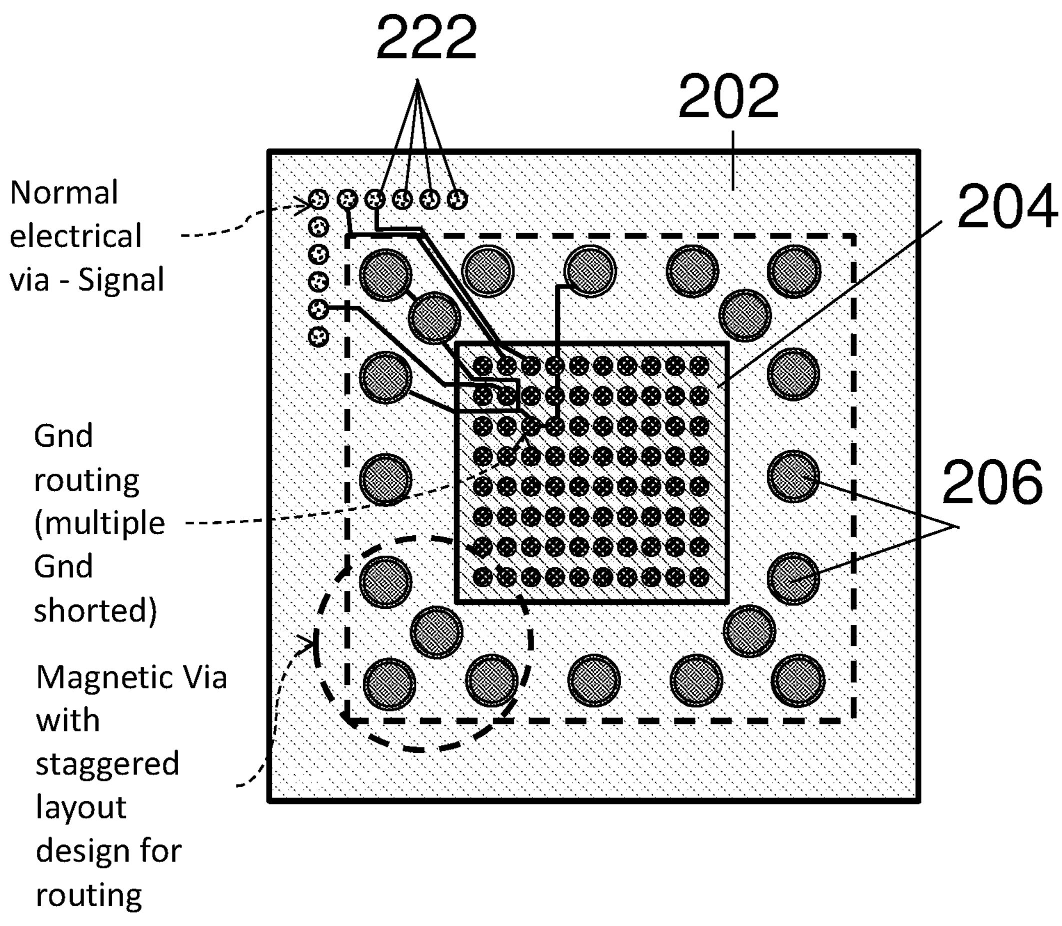
FIG. 2B shows a planar view of the semiconductor device or a semiconductor package according to various embodiments.

FIG. 2B shows a planar view of the semiconductor device or a semiconductor package 200 according to various embodiments. As shown on FIG. 2B, the plurality of ferromagnetic pins 206 or magnetic vias may surround the chip 204. The plurality of ferromagnetic pins or magnetic vias may form a staggered arrangement. At least some of the plurality of ferromagnetic pins 206 may be connected to chip 204. The at least some of the plurality of ferromagnetic pins 206 may be grounded. In addition, the semiconductor device or a semiconductor package 200 may further include one or more normal electrical vias 222. The one or more normal electrical vias 222 may also be electrically connected to chip 204 via electrical lines.

Figure 2C:
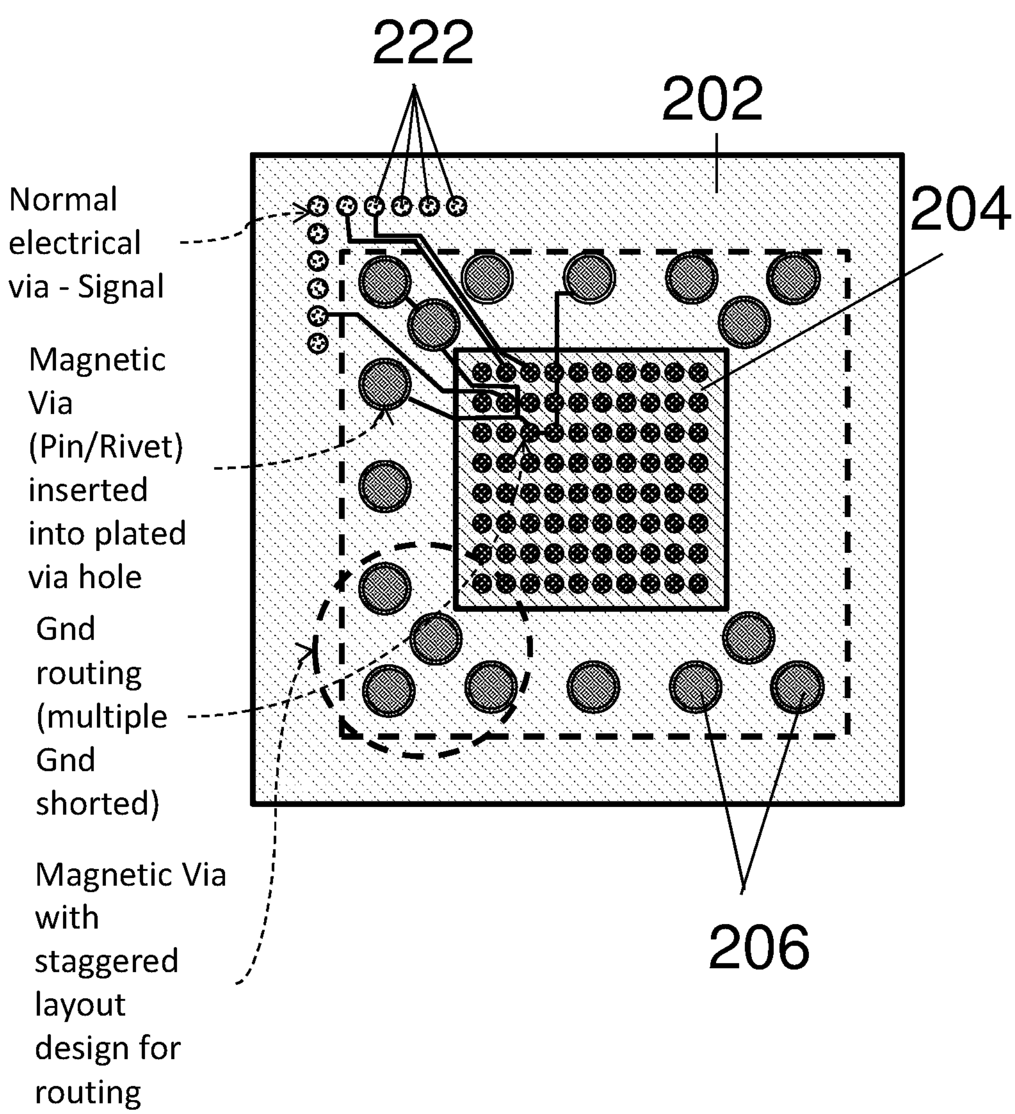
FIG. 2C shows a planar view of the semiconductor device or a semiconductor package according to various other embodiments.

FIG. 2C shows a planar view of the semiconductor device or a semiconductor package 200 according to various other embodiments. As shown in FIG. 2C, the plurality of ferromagnetic pins 206 or magnetic vias may not completely surround the chip 204.

Figure 2D:
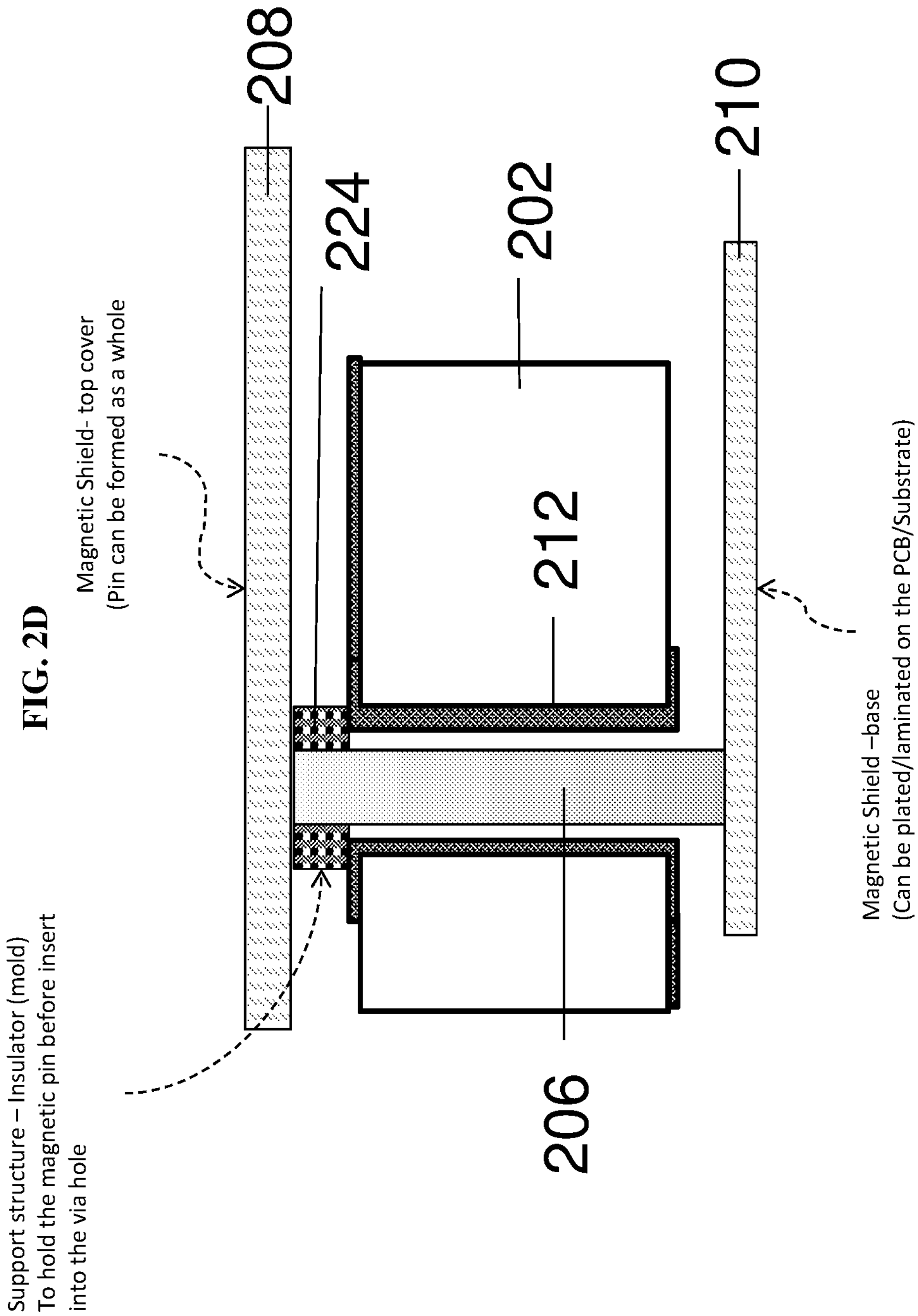
FIG. 2D is a cross-sectional schematic of a part of a semiconductor device or a semiconductor package according to various embodiments.
Figure 2E:
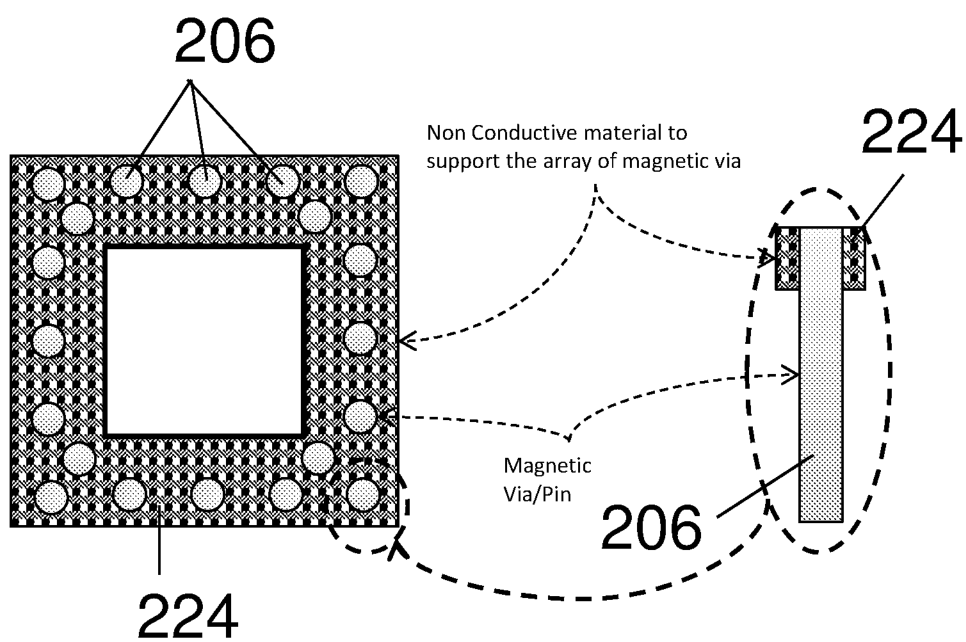
FIG. 2E shows a planar view of the semiconductor device or a semiconductor package according to various embodiments.

FIG. 2D is a cross-sectional schematic of a part of a semiconductor device or a semiconductor package 200 according to various embodiments. FIG. 2E shows a planar view of the semiconductor device or a semiconductor package 200 according to various embodiments. The semiconductor device or package 200 may further include a support structure 224, such as an encapsulation layer including a mold compound. A part of each of the prefabricated ferromagnetic pin 206 may be embedded in the mold compound.

In the fabrication of multiple magnetic vias, the assembly of the multiple ferromagnetic pins 206 into the substrate 202 may be cumbersome. In order to overcome this, the magnetic via array including the multiple magnetic vias may formed by molding all the magnetic pins 206 with a predetermined pattern in a non-conductive molding compound 224, as shown in FIG. 2E. The encapsulation layer 224 together with the plurality of ferromagnetic pins 224 may then be inserted onto the substrate 202 including the plurality of via holes 212. The pattern of via holes 212 on the substrate 202 may be the same as and may be aligned with the pattern of the plurality of ferromagnetic pins 206.

In various embodiments, the prefabricated magnetic via array may include the encapsulation layer 224 and the multiple ferromagnetic pins 206. The pins 206 may have the ends extending out of both opposing surfaces of the encapsulation layer. In various embodiments, one end of the ferromagnetic pins 206 may be inserted through via holes 212 of the substrate 202 to connect to the bottom shield 210 while the other end of the ferromagnetic pins 206 may be joined to the top shield 208.

As highlighted above, the positions of the ferromagnetic pins 206 may match the positions of the via holes 212 in the substrate 202, and the prefabricated magnetic via array may be inserted onto the substrate 202 at one go. This may help to reduce the assembly time.

Figure 2F:
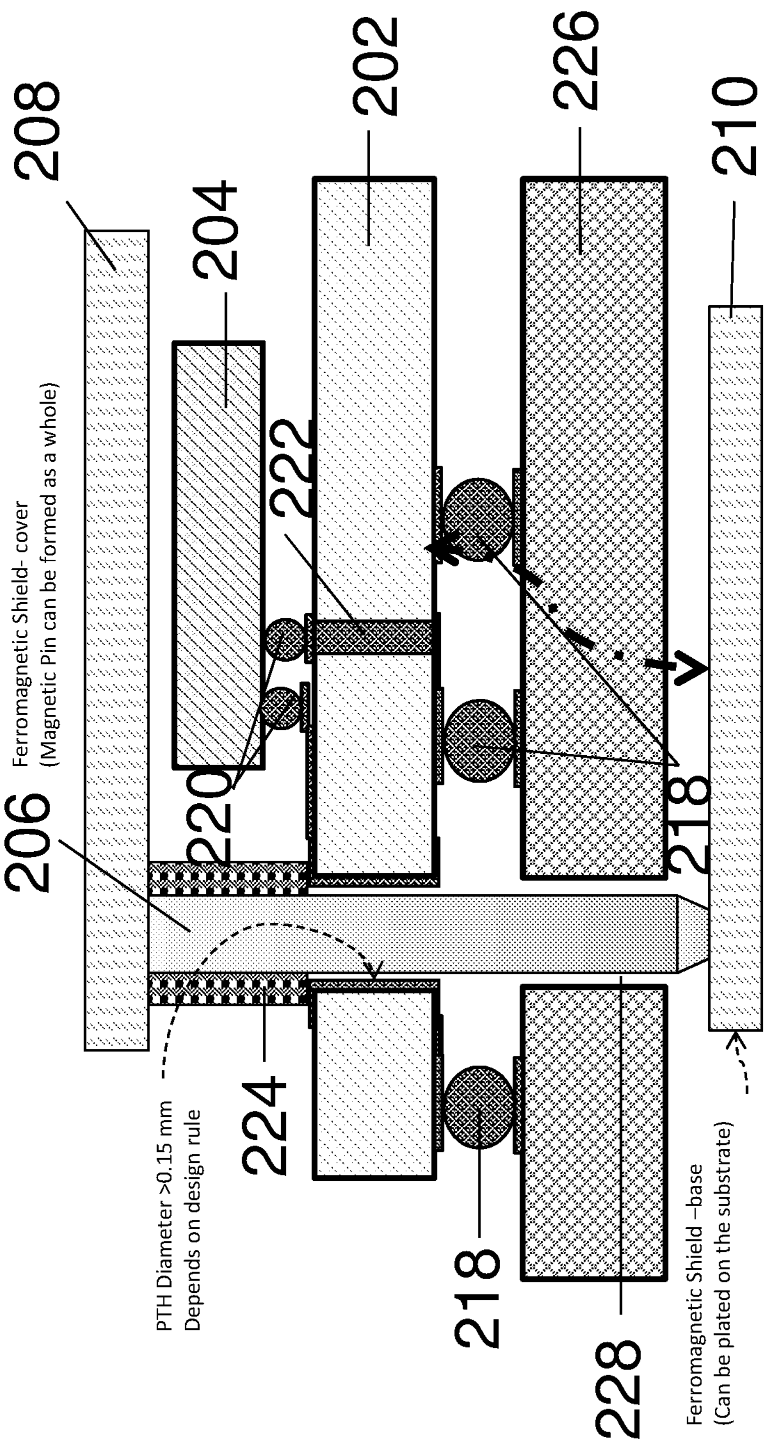
FIG. 2F is a cross-sectional schematic of a part of a semiconductor device or a semiconductor package according to various embodiments.

FIG. 2F is a cross-sectional schematic of a part of a semiconductor device or a semiconductor package 200 according to various embodiments. In various embodiments, the semiconductor device or a semiconductor package 200 may further include a printed circuit board (PCB) 226. The printed circuit board 226 may be arranged between the first magnetic shield structure 208 and the second magnetic shield structure 210. As shown in FIG. 2F, the ferromagnetic pin 206 may also pass through the printed circuit board 226. The printed circuit board 226 may include a through hole 228 to accommodate or hold the ferromagnetic pin 206.

The substrate 202 may be held by solder bumps 218 over the printed circuit board 226. The solder bumps 218 may be provided on the printed circuit board 226, and the substrate 202 may be arranged on the solder bumps 218. In various embodiments, the chip 204 may be electrically connected to the printed circuit board 226 by interconnections 220, solder bumps 218, as well as electrical connections of the substrate 202, including electrical via 222. The electrical via 222 may be a through via extending from a first surface of the substrate 202 to a second surface of the substrate opposite the first surface.

In various embodiments, the second magnetic shield structure 210 may be provided or arranged below the substrate 202, or over the printed circuit board 226, or below the printed circuit board 226. While FIG. 2F shows the printed circuit board 226 over the second magnetic shield structure 210 and below the printed circuit board 226, it may also be envisioned that in various embodiments, the second magnetic shield structure 210 may be over the printed circuit board 226. In other words, the second magnetic shield structure 210 may be between the printed circuit board 226 and the substrate 202/first magnetic shield structure 208.

Figure 2G:
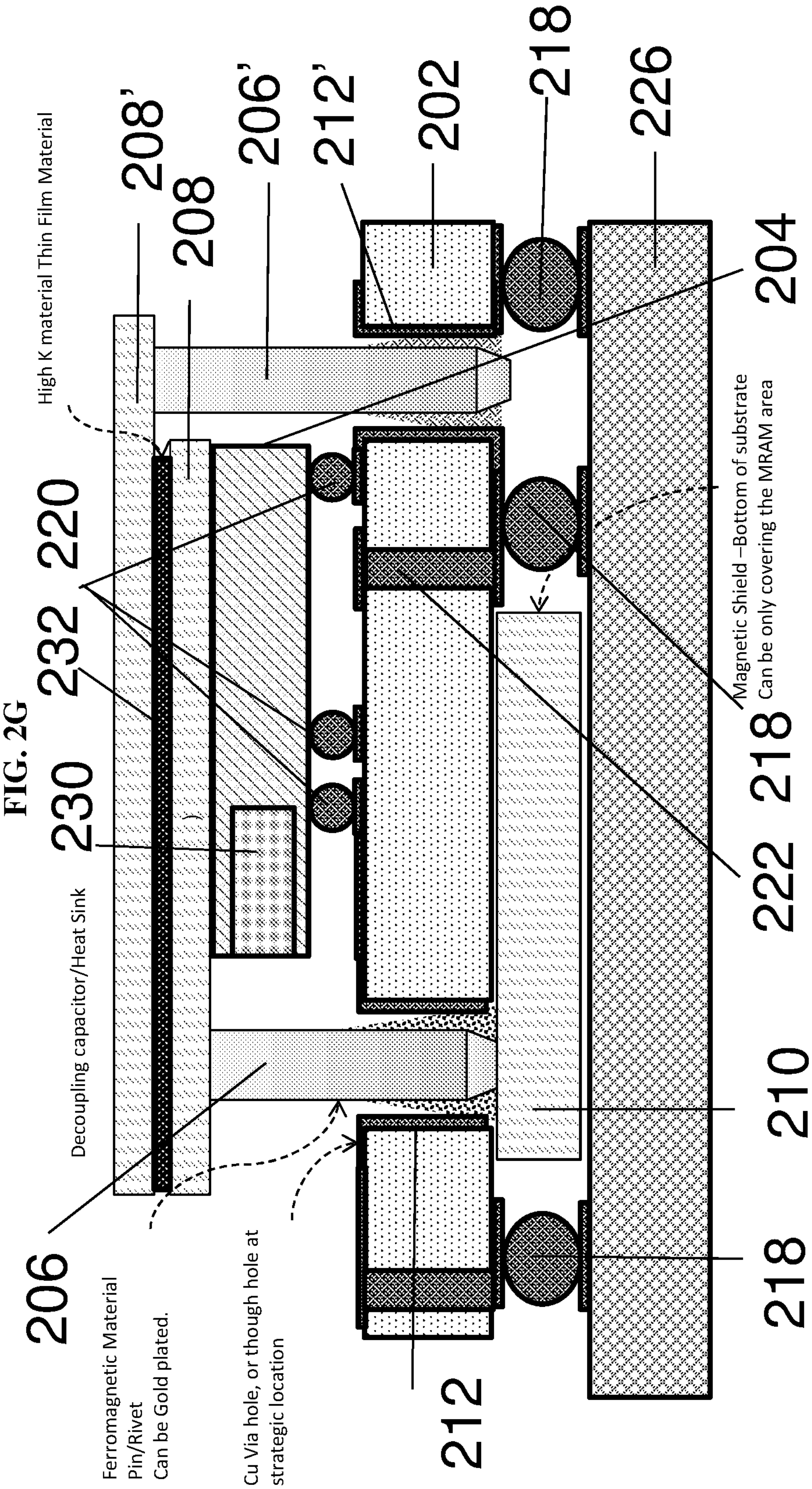
FIG. 2G is a cross-sectional schematic of a semiconductor device or a semiconductor package according to various embodiments.

FIG. 2G is a cross-sectional schematic of a semiconductor device or a semiconductor package 200 according to various embodiments. As shown in FIG. 2G, the second magnetic shield structure 210 may be between the printed circuit board 226 and the substrate 202. In addition, in various embodiments, only a portion of the chip 204 may contain the MRAM device 230.

As shown in FIG. 2G, the embedded second magnetic shield structure 210 may cover or overlap with the MRAM device 230, but may not cover or overlap the entire chip 204 (i.e. when the device or package 200 is arranged in an upright manner). In other words, the MRAM device 230 may be entirely directly over the second magnetic shield structure 210, while part of the chip 210 is not directly over second magnetic shield structure 210.

It may also be envisioned that in various embodiments, the first magnetic shield structure 208 may cover or overlap with the MRAM device 230, but may not cover or overlap with the entire chip 204. In other words, the MRAM device 230 may be entirely directly below the first magnetic shield structure 208, while part of the chip 210 may not be directly below the first shield structure 208.

The second magnetic shield 210 may be configured as a heat spreader or a heat sink.

Further, as shown in FIG. 2G, the device or package 200 may include a further first magnetic shield structure 208', in addition to the first magnetic shield structure 208. The further first magnetic shield structure 208' may be over the first magnetic shield structure 208. The substrate 202 may include a further via hole 212', in addition to the via hole 212. The device or package 200 may also include a further ferromagnetic pin 206', in addition to the ferromagnetic pin 206. The further ferromagnetic pin 206' may have a first portion held by the further via hole 212', and a second portion extending out from the further via hole 208' at the first surface of the substrate 202, the second portion attached to the further first magnetic shield structure 208'. The ferromagnetic pin 208 may also have a first portion held by the via hole 212, and a second portion extending from the via hole 212 at the first surface of the substrate 202, the second portion attached to the first magnetic shield structure 208. The third portion of the ferromagnetic pin 208 may be attached to the second magnetic shield structure 210, and may be held by the via hole 212.

The device or package 200 may also include an insulating layer 232 between the first magnetic shield structure 208 and the further first magnetic shield structure 208' such that the first magnetic shield structure 208, the insulating layer 232, and the one further first magnetic shield structure 208' form a capacitor. The insulating layer 232 may include a high-dielectric (high-κ) material.

In may also be envisioned that in various embodiments, the device or package 200 may include a further second magnetic shield structure, and an insulating layer between the second shield structure 210 and the further second magnetic shield structure.

In various embodiments, the first magnetic shield structure 208 may be electrically connected to a power (PWR) line, while the further first magnetic shield structure 208' may be electrically connected to a ground (GND) line. The first magnetic shield structure 208 may be at a suitable non-zero voltage, while the further first magnetic shield structure 208' may be at 0V. The first magnetic shield structure 208 may include a power (PWR) terminal for electrical coupling to the PWR line, and the further first magnetic shield structure 208; may include a GND terminal for electrical coupling to the GND line. The terminals may be plated by a metal such as gold or copper to reduce resistance.

Magnetic shield effectiveness is a function of the shield thickness. Instead of increasing the shield thickness, increasing the number of shield structures or layers may have a better effect. It has been shown that for the same volume of shield material, the shielding effectiveness may be better with increased number of shield structures or layers.

To take advantage of this characteristic and the inherent significant large footprint of the shield, the top shield and bottom shield may be formed from multiple structures or layers of magnetic shield, separated from one another by an insulating layer of high-κ material.

Various embodiments may include a metal-insulator-metal (MIM) capacitor, such as the one shown in FIG. 2G, and which may be used for power supply decoupling for the MRAM circuit. In various embodiments, the first magnetic shield structure 208 and the further first magnetic shield structure 208 may also act as a heat sink.

In a flip chip assembly, the magnetic shield is sitting on the chip backside may be extended to form a heat spreader or a heat sink.

Figure 2H:
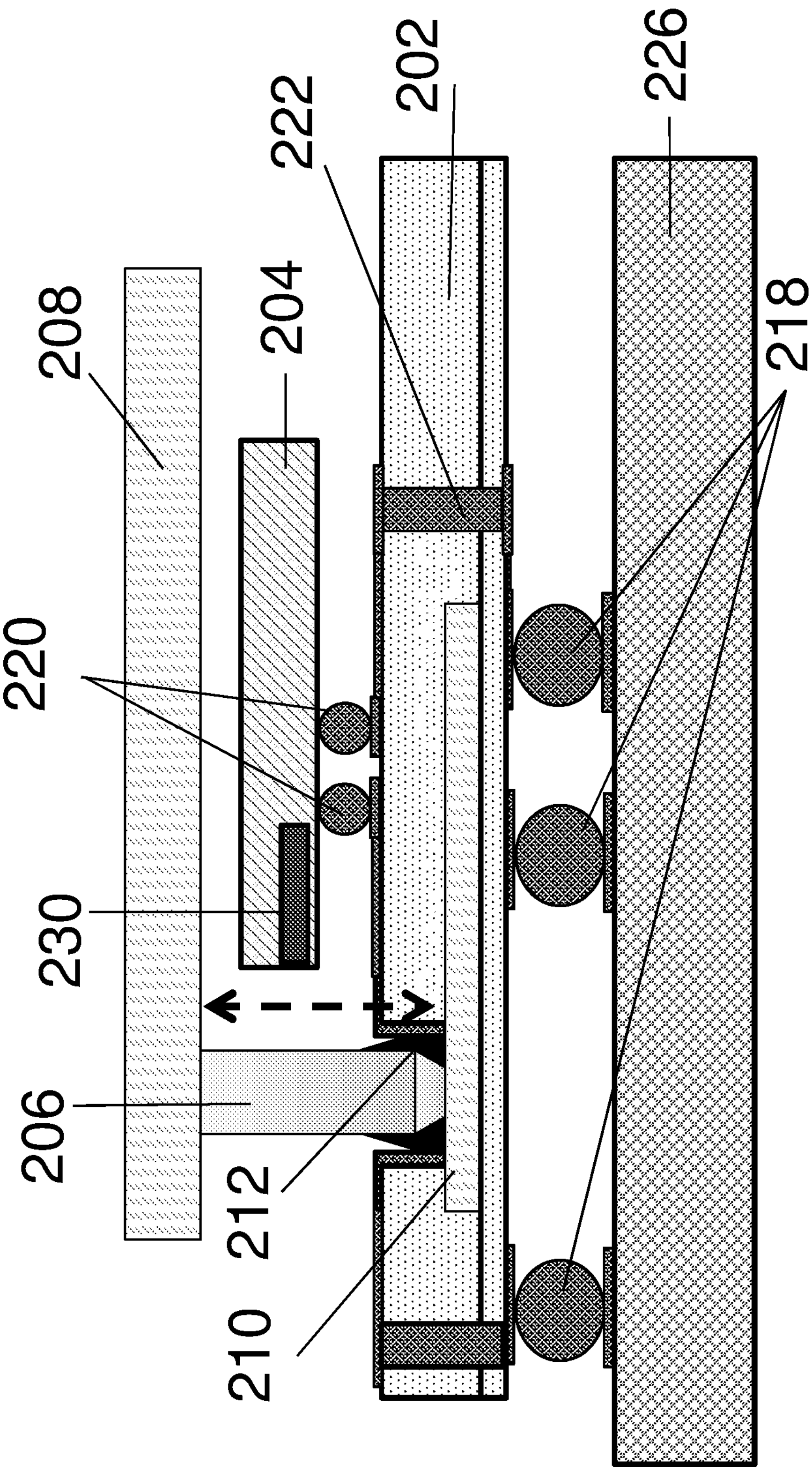
FIG. 2H shows a cross-sectional schematic of a semiconductor device or a semiconductor package according to various embodiments.

FIG. 2H shows a cross-sectional schematic of a semiconductor device or a semiconductor package 200 according to various embodiments. The semiconductor device or a semiconductor package 200 may include a substrate 202 including a via hole 212. The via hole 212 may not extend through the substrate 202. The semiconductor device or semiconductor package 200 may also include a chip 204 (containing device 230) attached to the substrate 202. The semiconductor device or semiconductor package 200 may further include a prefabricated ferromagnetic pin 206 having a first portion held by the via hole 212, a second portion extending from a first end of the first portion, and a third portion extending from a second end of the first portion opposite the first end. The semiconductor device or semiconductor package 200 may also include a first magnetic shield structure 208 attached to the second portion of the prefabricated ferromagnetic pin 206. The semiconductor device or semiconductor package 200 may further include a second magnetic shield structure 210 attached to the third portion of the prefabricated ferromagnetic pin 206, such that at least a portion of the chip is between the first magnetic shield structure 208 and the second magnetic shield structure 210. The second magnetic shield may be embedded within the substrate 202.

The chip 204 may be electrically connected to the printed circuit board 226 via interconnects 220, electrical connections of the substrate 202 including electrical through via 222, as well as solder bumps 218.

The second magnetic shield 210 may only cover or overlap with the device 230, but may not cover or overlap with the entire chip 204. The design shown in FIG. 2H may allow more area for electrical routing.

Figure 2I:
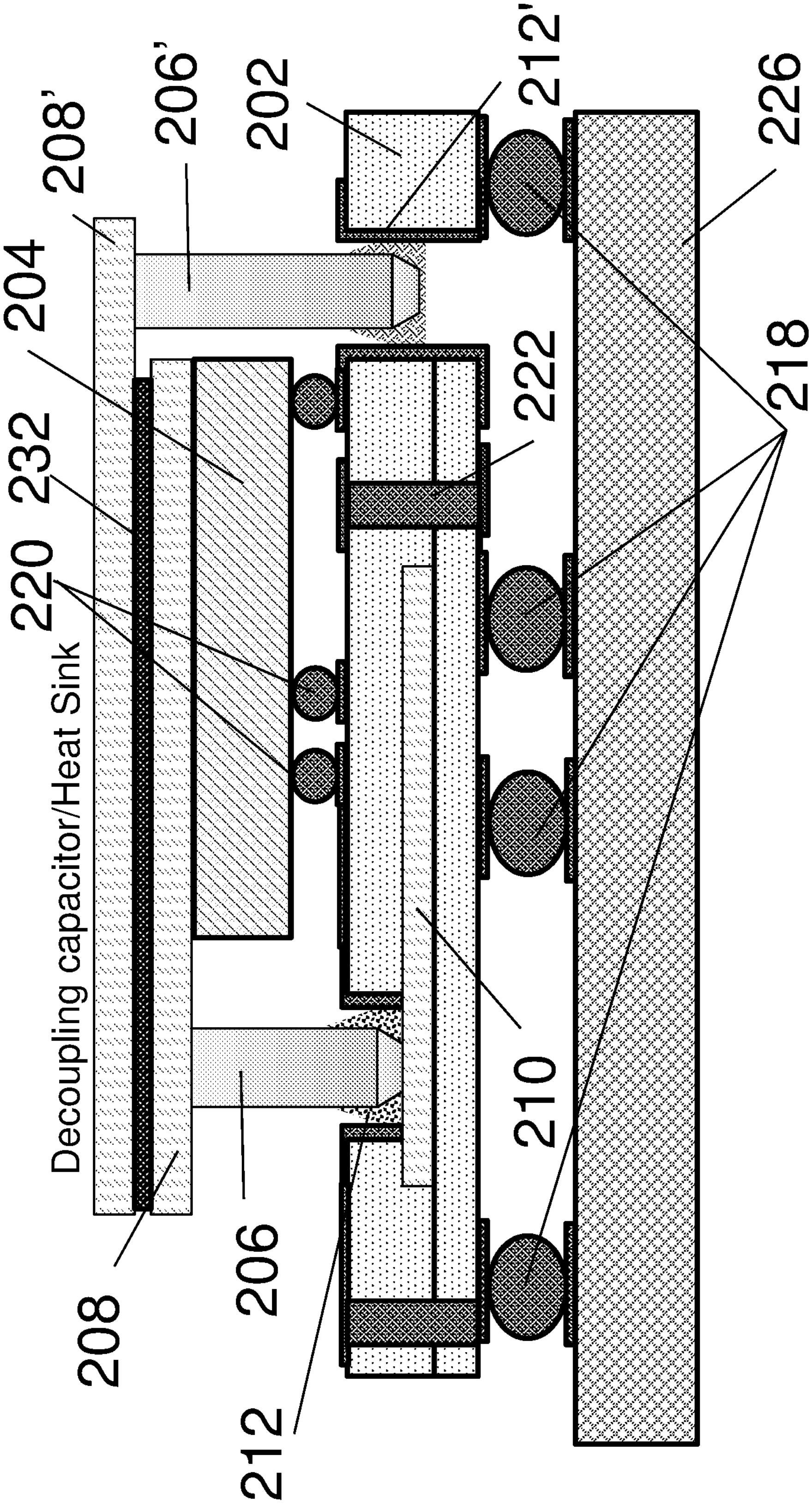
FIG. 2I shows a cross-sectional schematic of a semiconductor device or a semiconductor package according to various embodiments.

FIG. 2I shows a cross-sectional schematic of a semiconductor device or a semiconductor package 200 according to various embodiments. The semiconductor device or package 200 may include a substrate 202, a first magnetic shield structure 208 attached to ferromagnetic pin 206, and a further first magnetic shield structure 208' attached to further ferromagnetic pin 206'. The ferromagnetic pin 206 may be held by via hole 212, while the further ferromagnetic pin 206' may be held by further via hole 212'. An insulating layer 232 may be arranged or provided between the first magnetic shield structure 208 and the further first magnetic shield structure 208'. The second magnetic shield structure 210 may be attached to the ferromagnetic pin 206, so that the first magnetic shield structure 208 and the second magnetic shield structure 210 are at opposing ends of the ferromagnetic pin 206. The second magnetic shield structure 210 may be embedded in the substrate 202. The chip 204 may be electrically connected to the printed circuit board 226 via electrical via 222.

Figure 3:
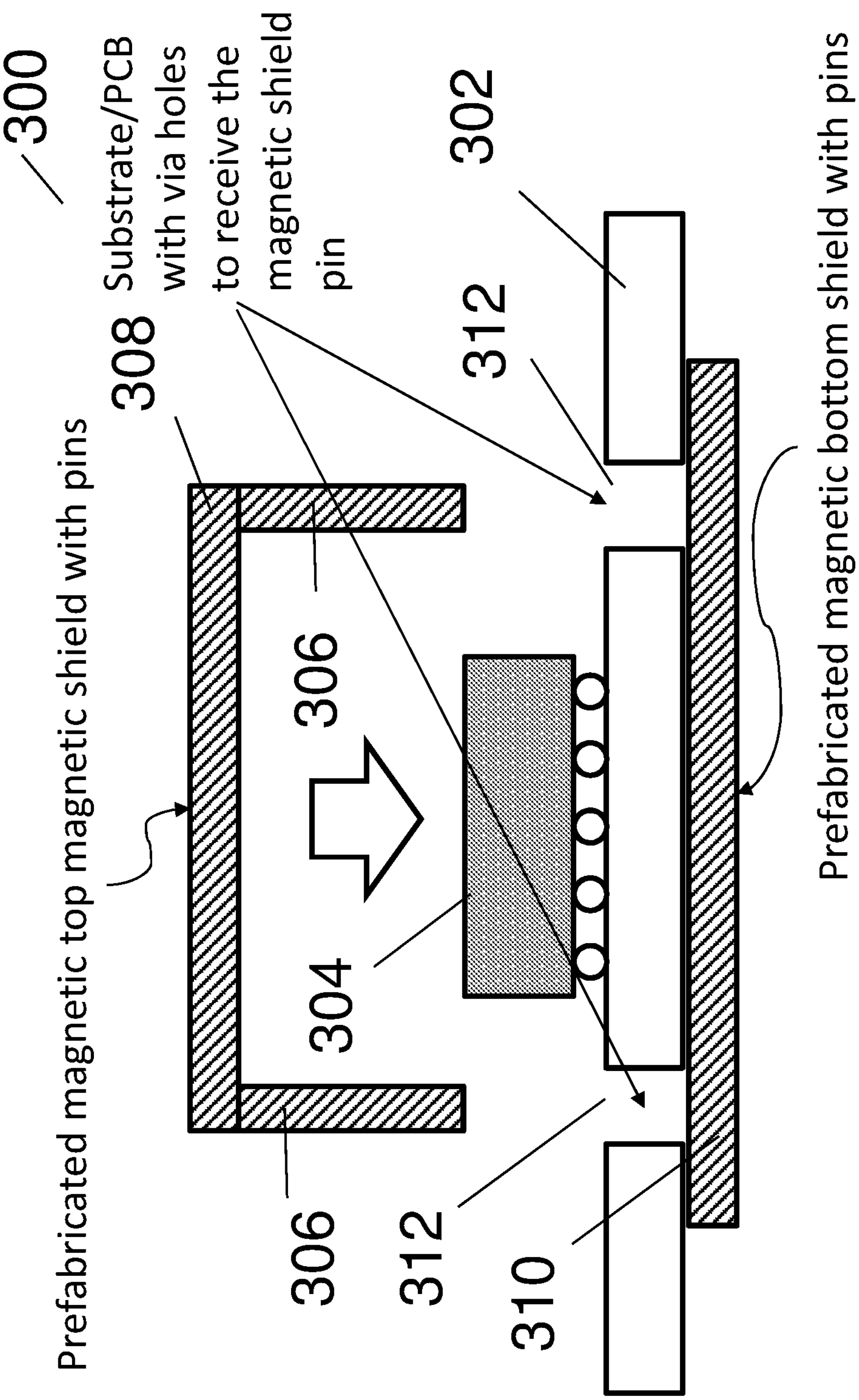
FIG. 3 shows a cross-sectional schematic of a semiconductor device or a semiconductor package according to various embodiments.

FIG. 3 is a cross-sectional schematic of a part of a semiconductor device or a semiconductor package 300 according to various embodiments.

The semiconductor device or semiconductor package 300 may include a substrate 302, such as a printed circuit board (PCB), including via holes 312 extending from a first surface of the substrate 302 to a second surface of the substrate 302 opposite the first surface. The semiconductor device or semiconductor package 300 may also include a chip 304, e.g. a MRAM integrated circuit (IC) chip, attached to the substrate 302. The semiconductor device or semiconductor package 300 may further include prefabricated ferromagnetic pins 306, each prefabricated ferromagnetic pin 306 having a first portion held by a respective via hole 312, and a second portion extending out from the respective via hole 312 at the first surface of the substrate 302. The semiconductor device or semiconductor package 300 may also include a first magnetic shield structure 308 extending out from the second portion of the prefabricated ferromagnetic pin 306. The first magnetic shield structure 308 and the prefabricated ferromagnetic pins 306 may form a whole assembly or structure. The whole assembly or structure may be brought together with the substrate 302 when the prefabricated ferromagnetic pins 306 are inserted into the via holes 312.

The semiconductor device or semiconductor package 300 may further include a second magnetic shield structure 310. The semiconductor device or semiconductor package 300 may also include further prefabricated ferromagnetic pins (not shown in FIG. 3) extending from the second magnetic shield structure 310. The second magnetic shield structure 310 and the further prefabricated ferromagnetic pins may form a further whole assembly or structure. The further whole assembly or structure may be brought together with the substrate 302 when the further prefabricated ferromagnetic pins 306 are inserted into further via holes of the substrate 302.

Figure 4A:
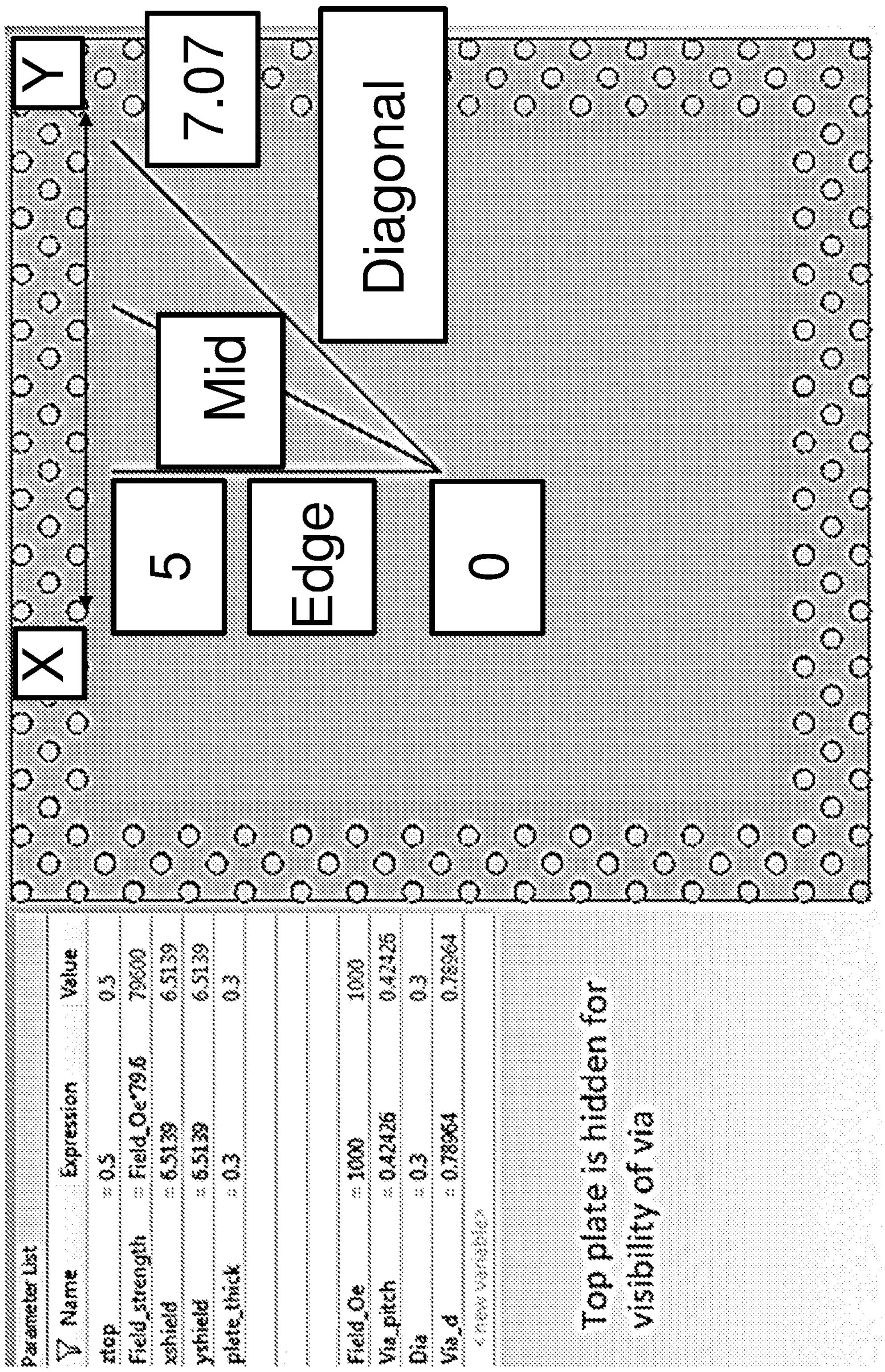
FIG. 4A shows a simulation setup of a package with three rows of magnetic vias according to various embodiments.
Figure 4B:
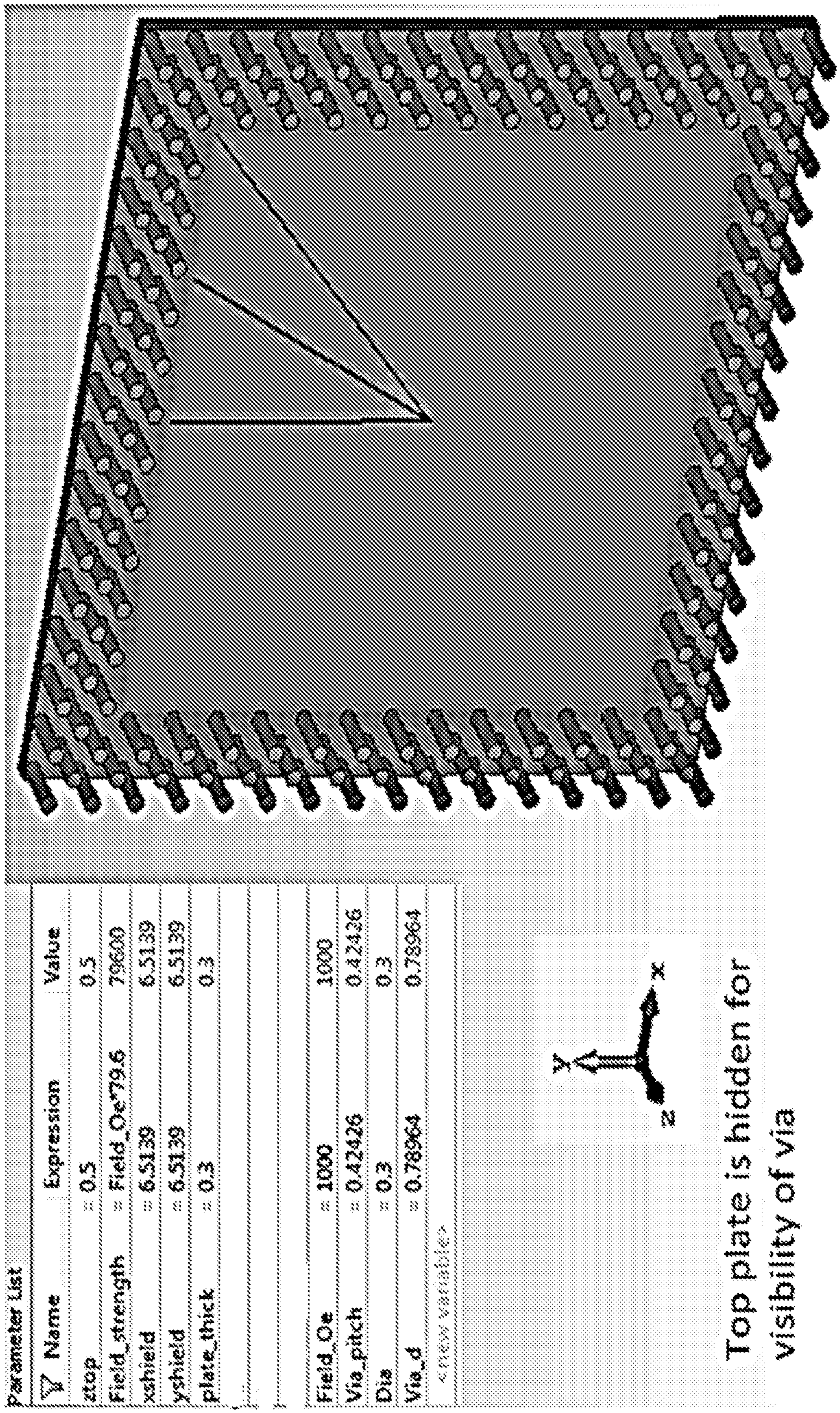
FIG. 4B shows the simulation setup of the package as shown in FIG. 4A according to various embodiments in a three-dimensional perspective view.

FIG. 4A shows a simulation setup of a package with three rows of magnetic vias according to various embodiments. FIG. 4B shows the simulation setup of the package as shown in FIG. 4A according to various embodiments in a three-dimensional perspective view. The model shows 3 rows of magnetic vias designed at the 4 sides of the package.

FIG. 4C shows a table showing the simulation results of the shielding effectiveness of packages with different number of magnetic vias according to various embodiments. The simulation results also show that the effectiveness of the shield is increased with increasing numbers of vias. The simulation results also include results relating to a magnetic shield with 4 side walls which forms a fully enclosed shield, which provides a bench mark for shield performance. The simulation results show that the shield effectiveness of 4 rows of magnetic vias may be better than the shield effectiveness of the fully enclosed shield. For an external field of 1200 Oe, the internal magnetic field for the fully enclosed shield is 475 Oe and the internal field for the 4 rows of magnetic via shield design is 290 Oe. This demonstrates that the magnetic via array may be an effective shielding solution.

Figure 4D:
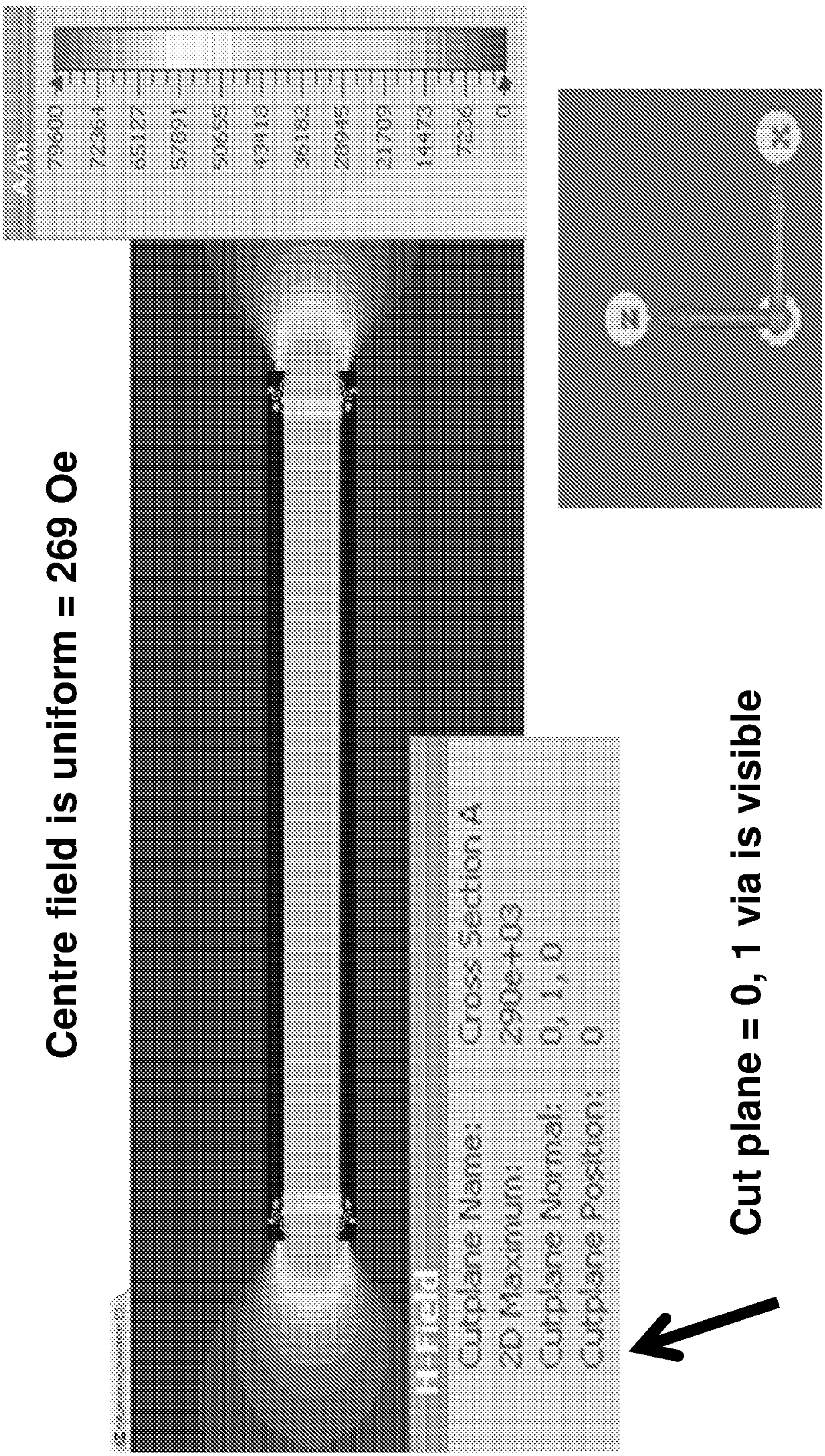
FIG. 4D is an image showing the magnetic field across the x-z plane of the package shown in FIGS. 4A-B according to various embodiments.
Figure 4E:
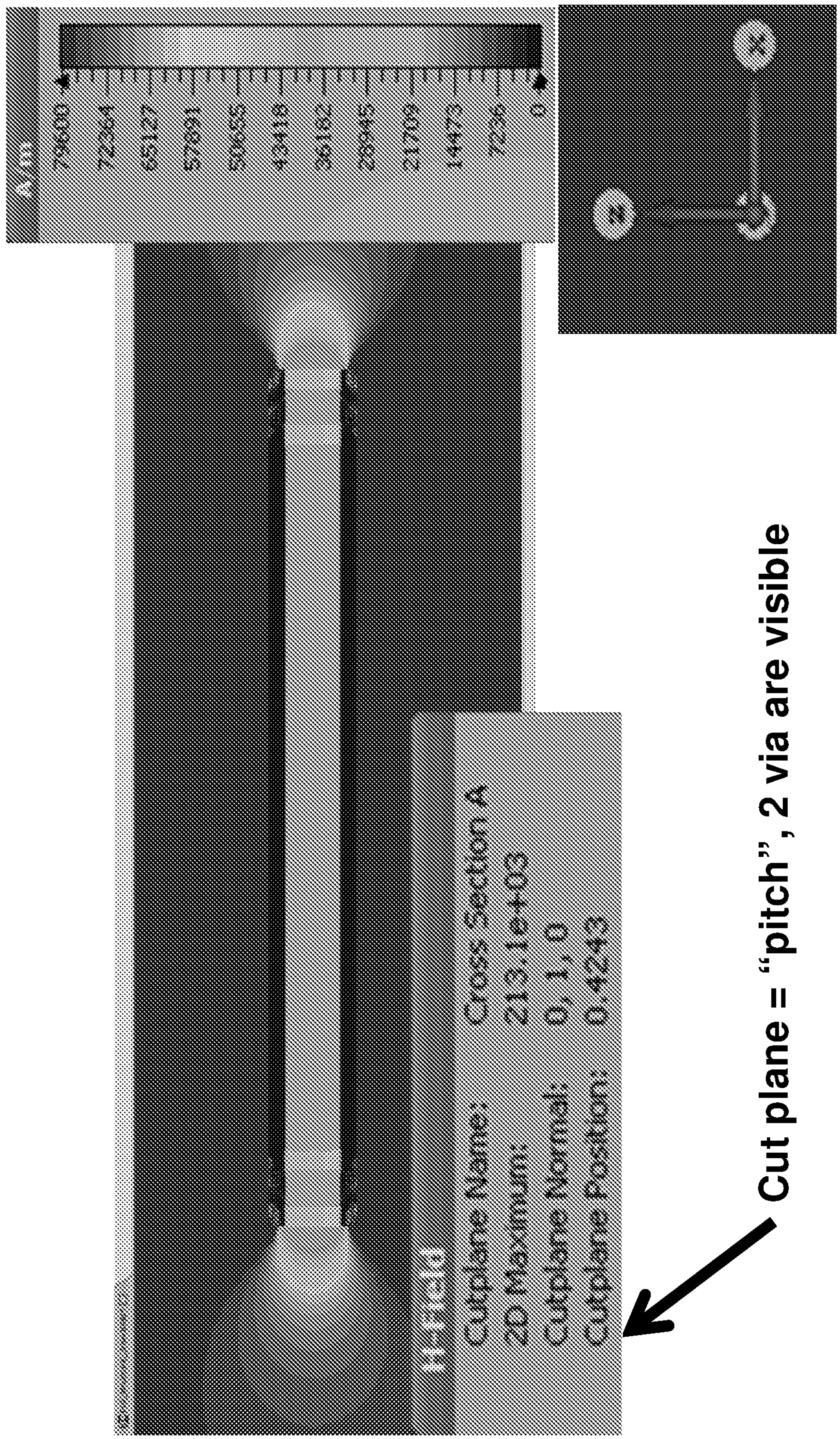
FIG. 4E is another image showing the magnetic field across the x-z plane of the package shown in FIGS. 4A-B according to various embodiments.
Figure 4F:
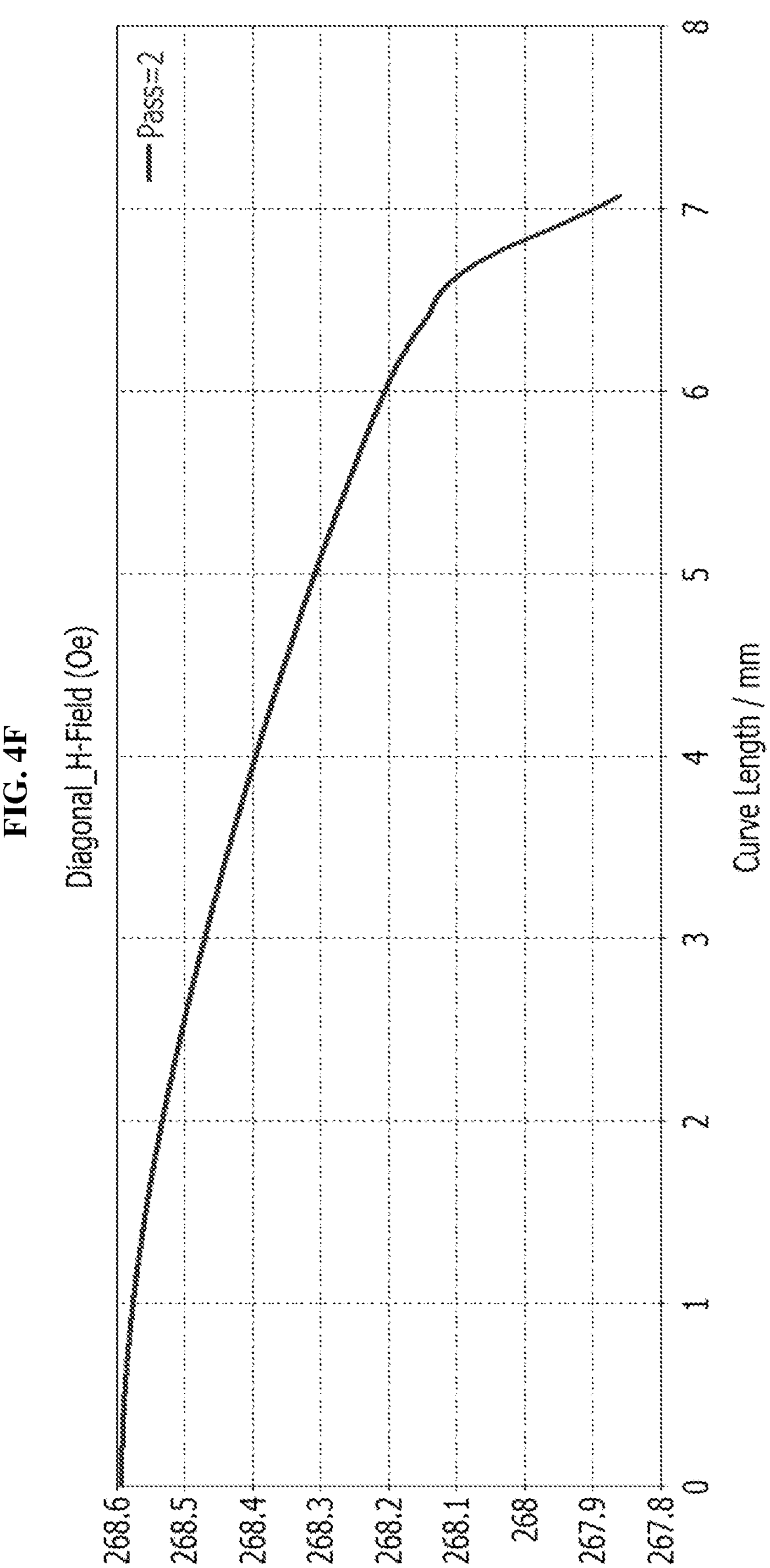
FIG. 4F is a plot of magnetic field (in Oersteds or Oe) along diagonal curve as a function of the curve length (in millimetres or mm) of the package including three rows of magnetic vias as shown in FIG. 4A-B according to various embodiments.

FIG. 4D is an image showing the magnetic field across the x-z plane of the package shown in FIGS. 4A-B according to various embodiments. FIG. 4E is another image showing the magnetic field across the x-z plane of the package shown in FIGS. 4A-B according to various embodiments. FIG. 4F is a plot of magnetic field (in Oersteds or Oe) along a diagonal curve as a function of the curve length (in millimetres or mm) of the package including three rows of magnetic vias as shown in FIG. 4A-B according to various embodiments. The external magnetic field may be set at 1000 Oe.

Figure 5:
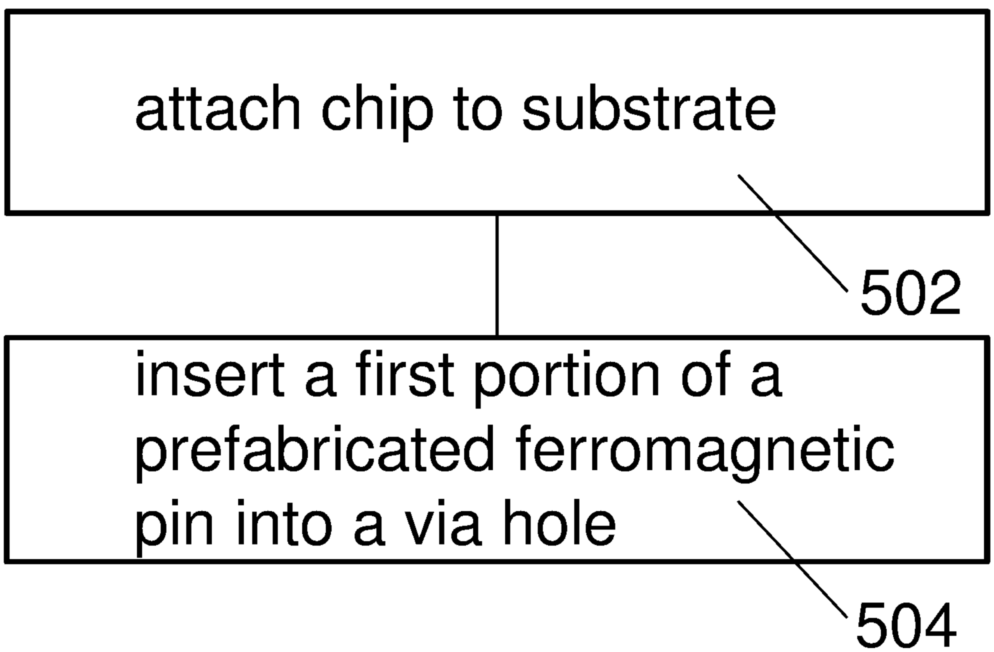
FIG. 5 is a schematic of a method of forming a semiconductor device or a semiconductor package according to various embodiments.

FIG. 5 is a schematic of a method of forming a semiconductor device or a semiconductor package according to various embodiments. The method may include, in 502, attaching a chip to a substrate including a via hole. The method may also include, in 504, inserting a first portion of a prefabricated ferromagnetic pin into a via hole so that the first portion is held by the via hole. The prefabricated ferromagnetic pin may include a second portion extending from a first end of the first portion, and a third portion extending from a second end of the first portion opposite the first end. The semiconductor device or the semiconductor package may include a first magnetic shield structure attached to or extended from the second portion of the prefabricated ferromagnetic pin. The semiconductor device or the semiconductor package may include a second magnetic shield structure attached to or extended from the third portion of the prefabricated ferromagnetic pin, such that at least a portion of the chip is between the first magnetic shield structure and the second magnetic shield structure.

In other words, various embodiments may relate to a method of forming a package or device. The method may include attaching a chip to a substrate, inserting a prefabricated pin onto a via hole of the substrate. The prefabricated pin may be attached to or extended from the first magnetic shield structure and the second magnetic shield structure on opposing ends of the pin.

In various embodiments, the method may include attaching the first magnetic shield structure to the second portion of the prefabricated ferromagnetic pin. In various embodiments, the method may include attaching the second magnetic shield structure to the third portion of the prefabricated ferromagnetic pin. The first magnetic shield structure may be attached to the second portion of the prefabricated ferromagnetic pin after or before the prefabricated ferromagnetic pin is inserted into the via hole. The second magnetic shield structure may be attached to the third portion of the prefabricated ferromagnetic pin after or before the prefabricated ferromagnetic pin is inserted into the via hole.

In various embodiments, the prefabricated ferromagnetic pin and the first magnetic shield structure (or the second magnetic shield structure) may be formed as a whole, i.e. as a single structure or assembly. The first magnetic shield structure (or the second magnetic shield structure) may extend from the prefabricated ferromagnetic pin. The first magnetic structure (or the second magentic structure) and the prefabricated ferromagnetic pin may be formed at the same time before being assembled to the substrate to form the semiconductor device or package.

For avoidance of doubt, FIG. 5 may not be in sequence. For instance, step 502 may occur before, after, or at the same time as step 504.

The via hole may extend from a first surface of the substrate to a second surface of the substrate opposite the first surface. In various embodiments, the second portion of the prefabricated ferromagnetic pin may extend out from the via hole at the first surface of the substrate. The third portion of the prefabricated ferromagnetic pin may extend out from the via hole at the second surface of the substrate.

In various embodiments, the substrate may include a plating layer on an inner wall of the via hole forming a plated via hole. The method may include forming the plating layer on the inner wall of the via hole.

In various embodiments, the method may include encapsulating a plurality of ferromagnetic pins including the prefabricated ferromagnetic pin and one or more further prefabricated ferromagnetic pins with a mold compound so that a part of each of the plurality of ferromagnetic pins is embedded in the mold compound.

The method may also include inserting the plurality of ferromagnetic pins into a plurality of via holes including the via hole and one or more further via holes on the substrate after encapsulating the plurality of ferromagnetic pins with the mold compound.

The method may also include inserting a first portion of a further prefabricated ferromagnetic pin into a further via hole so that the first portion is held by the further via hole. The further prefabricated ferromagnetic pin may also include a second portion extending from a first end of the first portion, and a third portion extending from a second end of the first portion opposite the first end. The second portion of the further prefabricated ferromagnetic pin may extend out from the further via hole at the first surface of the substrate, and the third portion of the further prefabricated ferromagnetic pin may extend out from the further via hole at the second surface of the substrate.

The method may further include attaching a further first magnetic shield structure to the second portion of the further prefabricated ferromagnetic pin. The method may also include forming an insulator layer between the first magnetic shield structure and the further magnetic shield structure to form a capacitor.

Figure 6A:
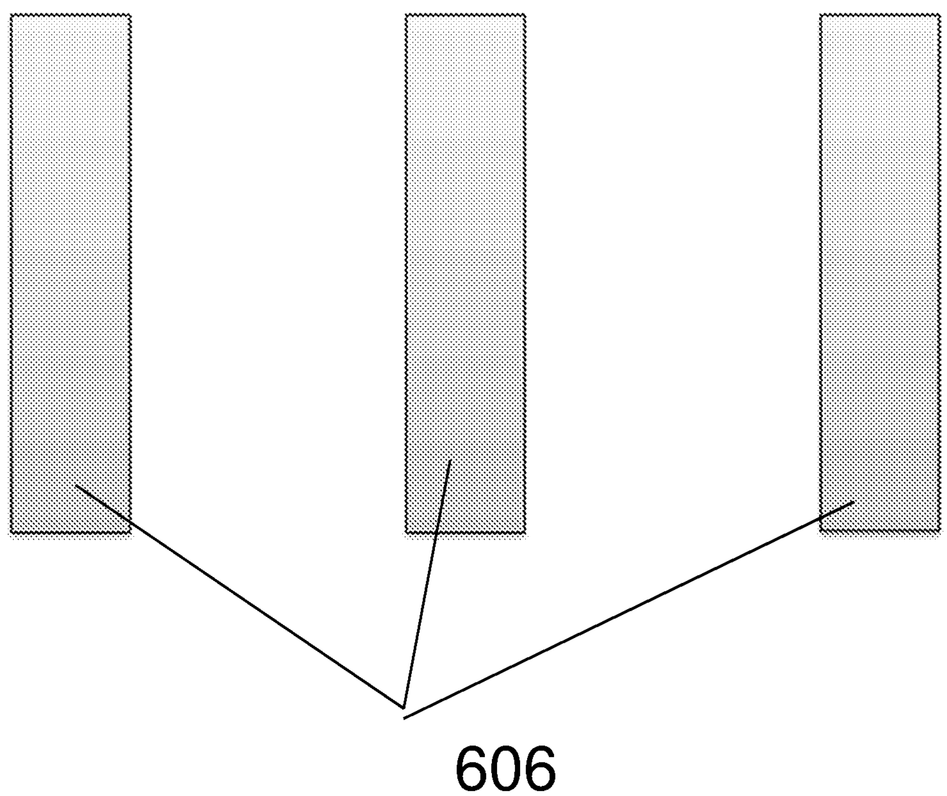
FIG. 6A is a cross-sectional schematic showing a plurality of prefabricated ferromagnetic pins according to various embodiments.
Figure 6B:
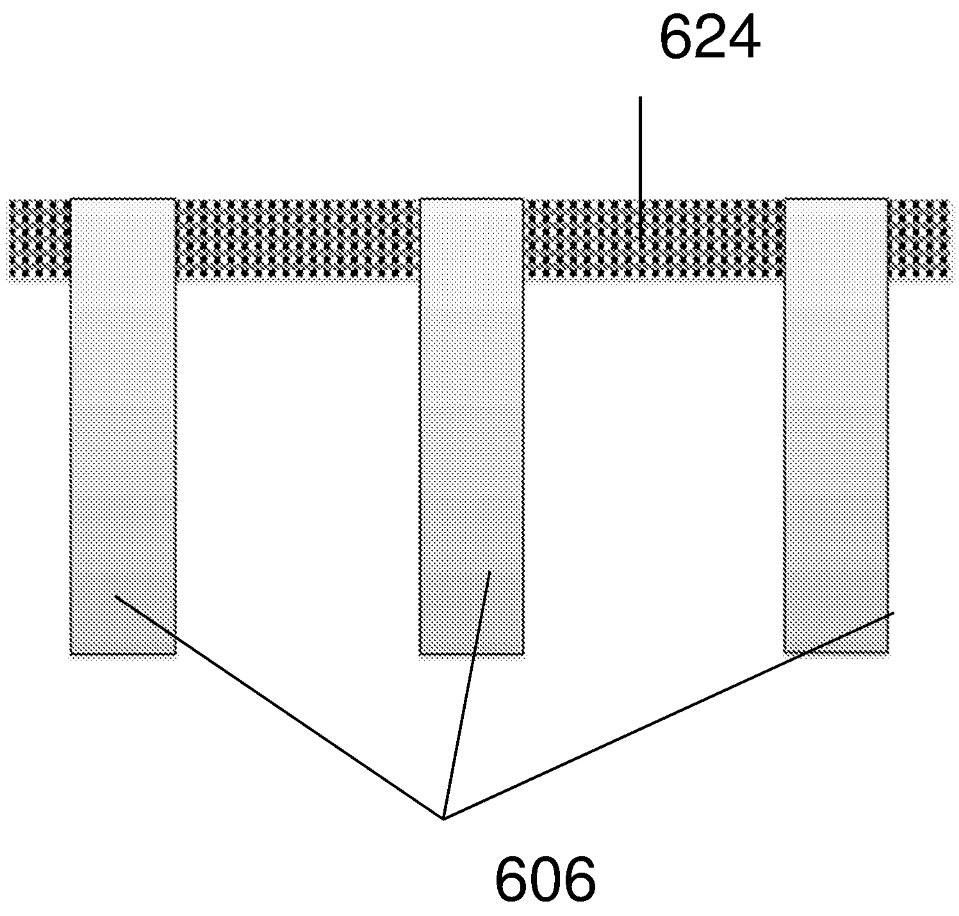
FIG. 6B is a cross-sectional schematic showing molding the prefabricated ferromagnetic pins in a molding compound according to various embodiments.

FIGS. 6A-F show a method of forming a semiconductor device or package according to various embodiments. FIG. 6A is a cross-sectional schematic showing a plurality of prefabricated ferromagnetic pins 606 according to various embodiments. FIG. 6B is a cross-sectional schematic showing molding the prefabricated ferromagnetic pins 606 in a molding compound 624 according to various embodiments. The prefabricated ferromagnetic pins 606 and the molding compound 624 may form a single assembly. The method may include encapsulating a plurality of ferromagnetic pins 606 with the mold compound 624 so that a part of each of the plurality of ferromagnetic pins 606 is embedded in the mold compound 624. The mold compound 624 may form a support structure or encapsulation layer.

Figure 6C:
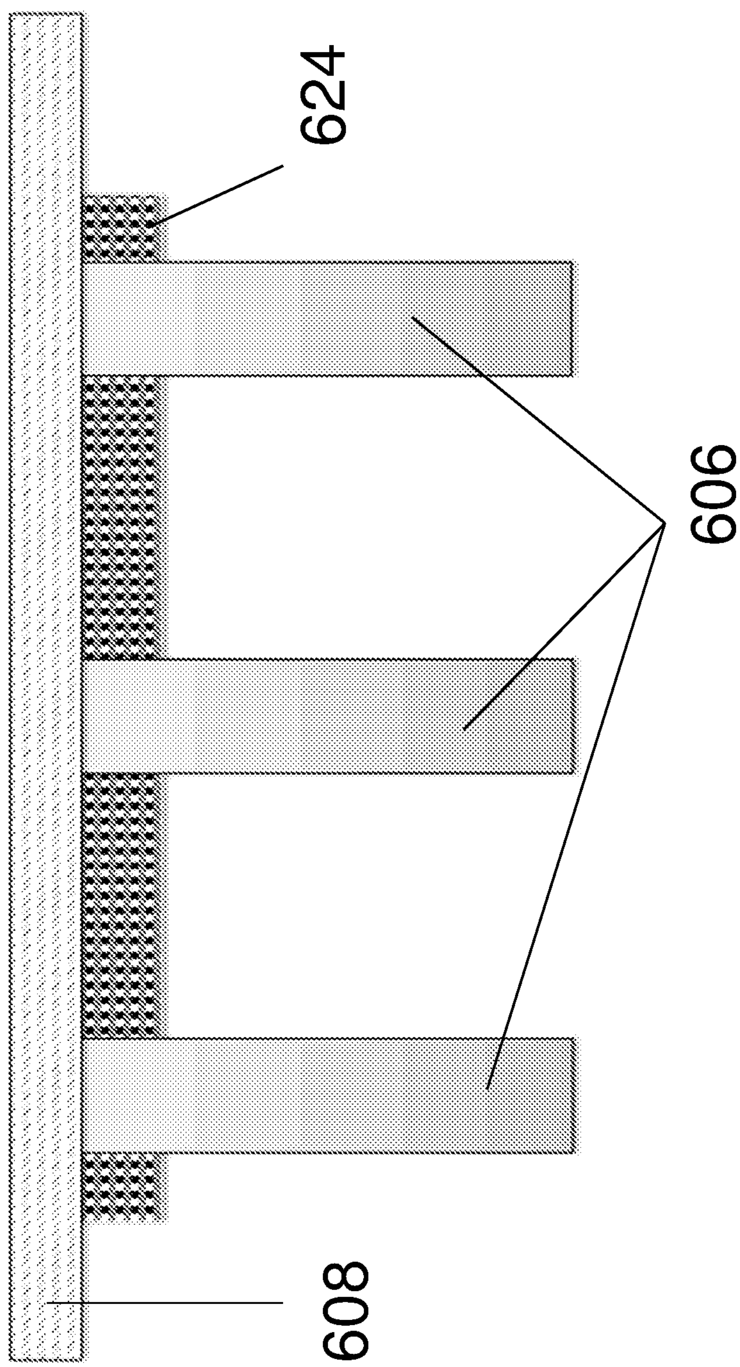
FIG. 6C is a cross-sectional schematic showing attaching or assembling a first magnetic shield structure to the plurality of prefabricated ferromagnetic pins according to various embodiments.

FIG. 6C is a cross-sectional schematic showing attaching or assembling a first magnetic shield structure 608 to the plurality of prefabricated ferromagnetic pins 606 according to various embodiments. The first magnetic shield structure 608 may be attached on the molding compound 624, after the molding of the prefabricated ferromagnetic pins 606 in the molding compound 624.

It may also be envisioned that in various alternate embodiments, the first magnetic shield structure 608 may be fabricated together with the ferromagnetic pins 606 as a single assembly. The assembly may include the ferromagnetic pins 606 extending from the first magnetic shield structure 608. The assembly may or may not be molded with the mold compound 624.

Figure 6D:
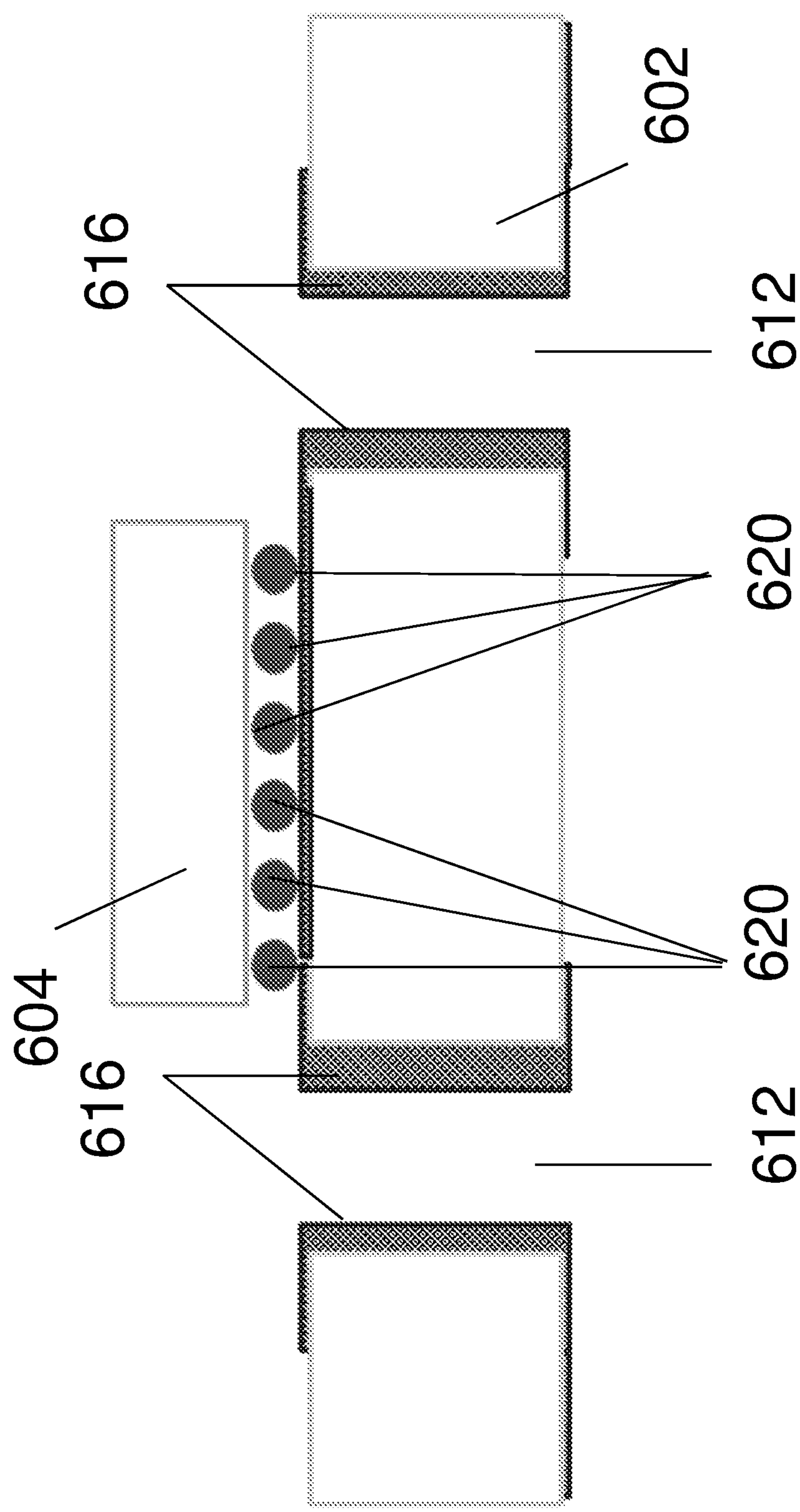
FIG. 6D is a cross-sectional schematic showing attaching or assembling a chip on to a substrate 602 according to various embodiments.

FIG. 6D is a cross-sectional schematic showing attaching or assembling a chip 604 on to a substrate 602 according to various embodiments. The chip 604 may be a MRAM chip. The chip 604 may be attached to the substrate via interconnections 620. The substrate 602 may include a plurality of via holes 612. The via holes 612 may be plated with a suitable metal 616, such as copper. In various alternative embodiments, the via holes 612 may be unplated.

Figure 6E:
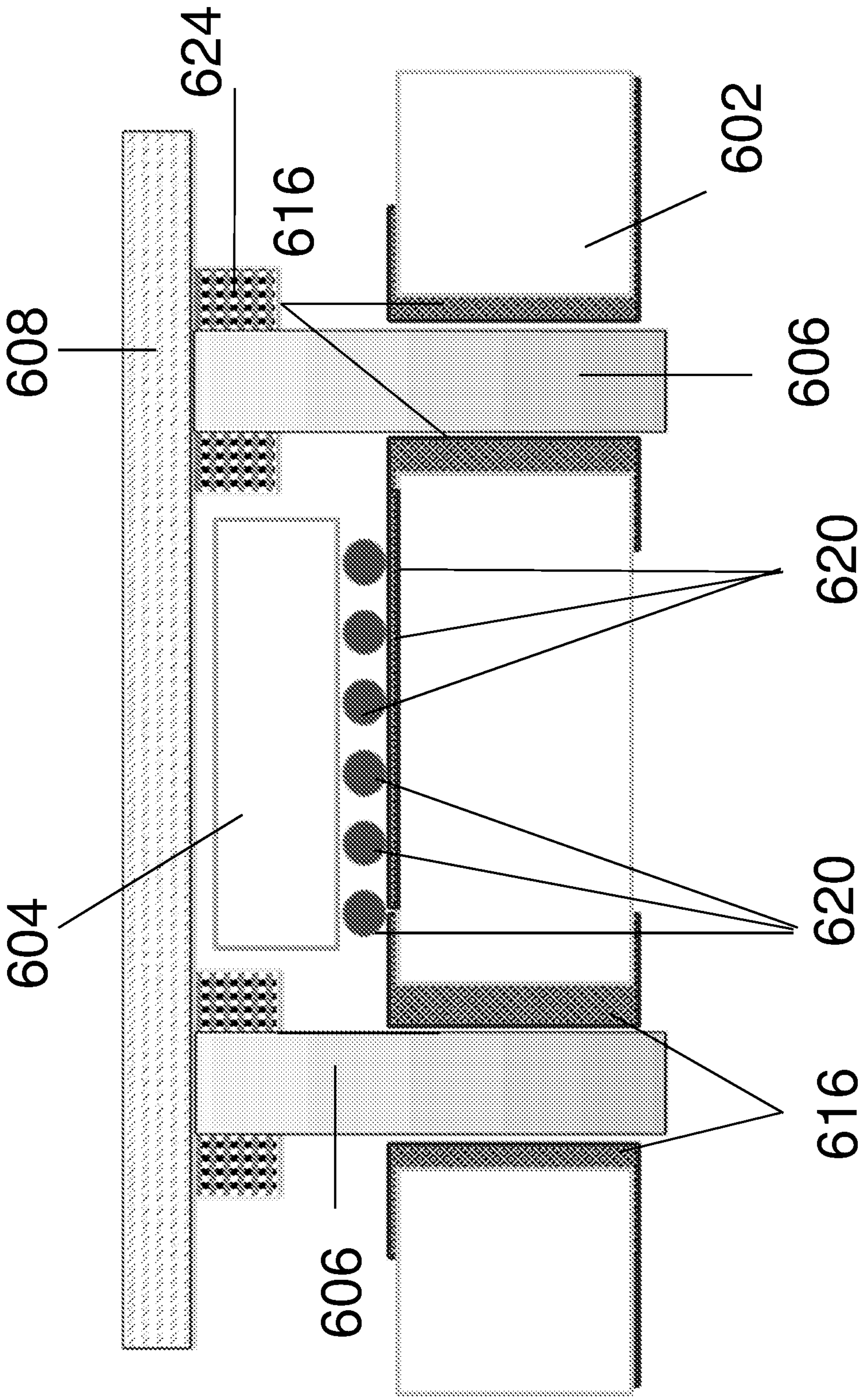
FIG. 6E is a cross-sectional schematic showing assembling of the plurality of prefabricated ferromagnetic pins with the first magnetic shield structure and the molding compound onto the substrate according to various embodiments.

FIG. 6E is a cross-sectional schematic showing assembling of the plurality of prefabricated ferromagnetic pins 606 with the first magnetic shield structure 608 and the molding compound 624 onto the substrate 624 according to various embodiments. The prefabricated ferromagnetic pins 606 may be aligned with the via holes 608, and may be inserted into the via holes 608.

Figure 6F:
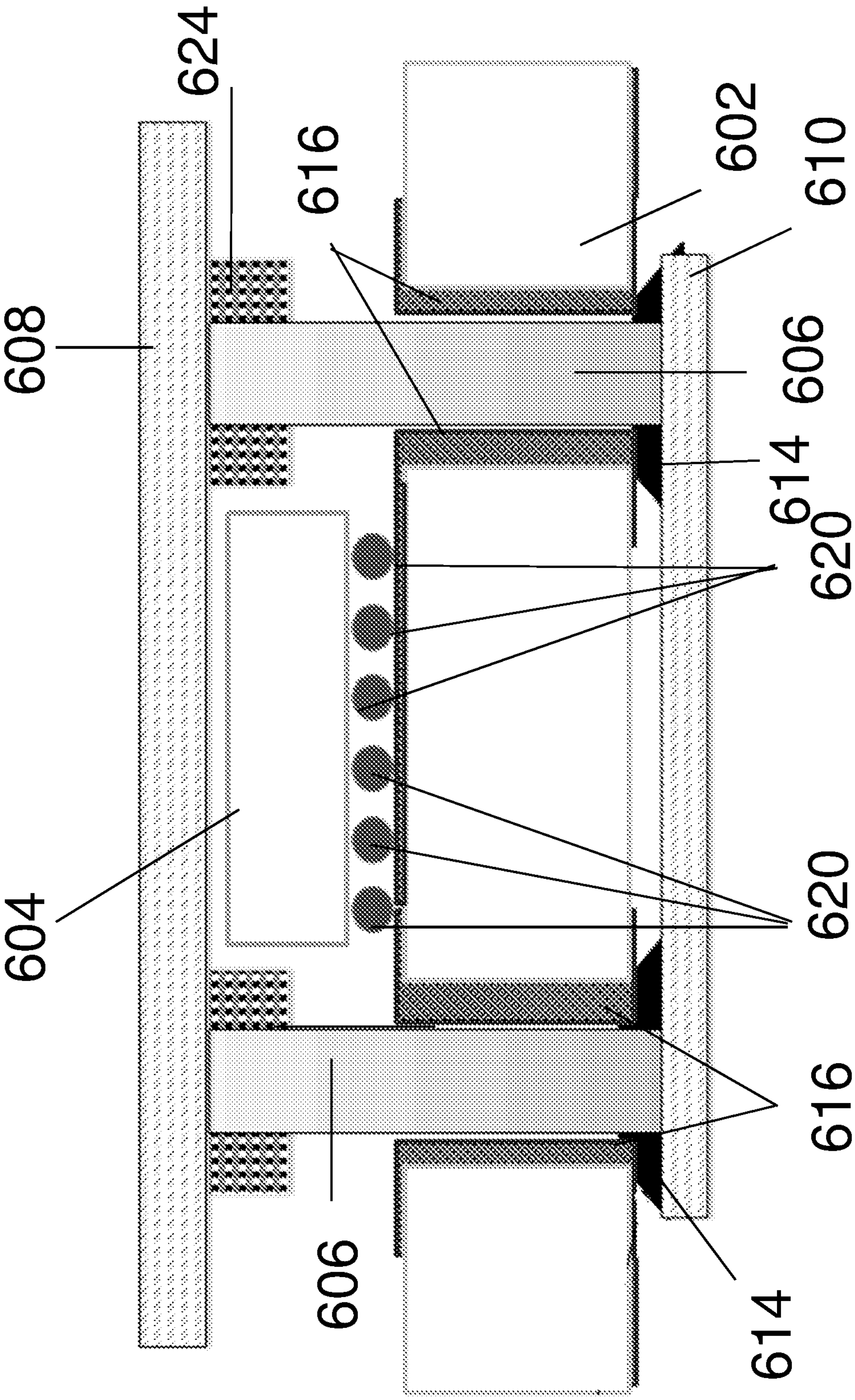
FIG. 6F is a cross-sectional schematic showing attaching of the second magnetic shield structure to the plurality of prefabricated ferromagnetic pins according to various embodiments.

FIG. 6F is a cross-sectional schematic showing attaching of the second magnetic shield structure 610 to the plurality of prefabricated ferromagnetic pins 606 according to various embodiments. The second magnetic shield structure 610 may be attached to the plurality of prefabricated ferromagnetic pins 606 using magnetic epoxy 614.

It may also be envisioned that in various alternative embodiments, of the second magnetic shield structure 610 may be embedded in the substrate 602 or the fan-out wafer level package (FOWLP).

Ferromagnetic shielding may be required for MRAM device integrated on high density I/O IC. The ferromagnetic shielding may require a vertical magnetic connection to form effective shielding, and at the same time be able to provide access for the electrical connection.

In various embodiments, a close magnetic path of high permeability may be formed from the top lateral ferromagnetic shield to the bottom lateral ferromagnetic shield via the vertical ferromagnetic pins formed or inserted through via holes in the substrate. The MRAM device may be placed or arranged between the top shield and the bottom shield.

The prefabricated ferromagnetic pin and/or via hole array may be used to reduce the assembly time. More than a row of pins and/or via holes may be designed and the rows can be designed in staggered pattern to improve the shielding efficiency.

The pins may also be formed with either the top shield or the bottom shield. The pins may extend from the top shield or bottom shield. Ferromagnetic epoxy can be used to attach the ferromagnetic pins to the shield to improve the shielding efficiency.

Ferromagnetic epoxy can be used to fill the substrate via holes to connect the top shield and the bottom shield.

The spacing between the ferromagnetic vias may be used for electrical routing.

The via holes in the substrate/PCB may either be an unplated through hole, a plated through hole or a backdrilled plated hole.

The plated via holes may also be used for electrical connection (power and ground).

The shield may be designed with multilayer for shielding improvement and also to form decoupling capacitor and heat sink.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A semiconductor package comprising:

a substrate comprising a via hole extending from a first surface of the substrate to a second surface of the substrate opposite the first surface;

a chip attached to the substrate;

a prefabricated ferromagnetic pin having a first portion held by the via hole, a second portion extending out from the via hole at the first surface of the substrate, and a third portion extending out from the via hole at the second surface of the substrate;

a first magnetic shield structure attached to or extended from the second portion of the prefabricated ferromagnetic pin;

a second magnetic shield structure attached to or extended from the third portion of the prefabricated ferromagnetic pin, such that at least a portion of the chip is between the first magnetic shield structure and the second magnetic shield structure;

a plating layer on an inner wall of the via hole, the plating layer in electrical connection with the prefabricated ferromagnetic pin, the plating layer comprising an electrically conductive non-ferromagnetic material;

a first amount of a ferromagnetic epoxy between the first portion of the prefabricated ferromagnetic pin and the first magnetic shield structure for attaching the first magnetic shield structure to the prefabricated ferromagnetic pin; and a second amount of the ferromagnetic epoxy between the third portion of the prefabricated ferromagnetic pin and the second magnetic shield structure for attaching the second magnetic shield structure to the prefabricated ferromagnetic pin;

wherein the first amount of the ferromagnetic epoxy and the second amount of the ferromagnetic epoxy are configured to improve magnetic shielding performance of the first magnetic shield structure, the second magnetic shield structure and the prefabricated ferromagnetic pin.

2. The semiconductor package according to claim 1, wherein the prefabricated ferromagnetic pin comprises a non-ferromagnetic plating layer.

3. The semiconductor package according to claim 1, further comprising:

an electrical line in electrical connection with the plating layer;

wherein the electrical line is a ground line or a power line.

4. The semiconductor package according to claim 1, wherein the substrate comprises one or more further via holes; and wherein the semiconductor package comprises:

one or more further first magnetic shield structures; and one or more further prefabricated ferromagnetic pins, each of the one or more further prefabricated ferromagnetic pins having a first portion held by a respective further via hole of the one or more further via holes and a second portion extending out from the respective further via hole at the first surface of the substrate, the second portion attached to or extended from a respective further first magnetic shield structure of the one or more further first magnetic shield structures.

5. The semiconductor package according to claim 4, further comprising:

an encapsulation layer comprising a mold compound; wherein a part of each of the prefabricated ferromagnetic pin and the one or more further prefabricated ferromagnetic pins is embedded in the mold compound.

6. The semiconductor package according to claim 5, wherein the encapsulation layer is between the substrate and the first magnetic shield structure.

7. The semiconductor package according to claim 4, wherein the via holes and the one or more further via holes form a staggered arrangement.

8. The semiconductor package according to claim 4, wherein the prefabricated ferromagnetic pin and the one or more further prefabricated ferromagnetic pins form a plurality of ferromagnetic pins.

9. The semiconductor package according to claim 4, further comprising:

an insulating layer between the first magnetic shield structure and one further first magnetic shield structure of the one or more further first magnetic shield structures such that the first magnetic shield structure, the insulating layer, and the one further first magnetic shield structure form a capacitor.

10. The semiconductor package according to claim 9, wherein the insulator layer comprises a high-dielectric (high-κ) material.

11. The semiconductor package according to claim 1, wherein the first magnetic shield structure or the second magnetic shield structure forms a heat spreader.

12. The semiconductor package according to claim 1, wherein the chip comprises a magnetic random access memory (MRAM) device.

13. A method of forming a semiconductor package, the method comprising:

attaching a chip to a substrate comprising a via hole extending from a first surface of the substrate to a second surface of the substrate opposite the first surface;

inserting a first portion of a prefabricated ferromagnetic pin into a via hole so that the first portion is held by the via hole, with a second portion of the prefabricated ferromagnetic pin extending out from the via hole at the first surface of the substrate, and a third portion of the prefabricated ferromagnetic pin extending out from the via hole at the second surface of the substrate;

wherein the semiconductor package further comprises a first magnetic shield structure attached to or extended from the second portion of the prefabricated ferromagnetic pin;

wherein the semiconductor package also comprises a second magnetic shield structure attached to or extended from the third portion of the prefabricated ferromagnetic pin, such that at least a portion of the chip is between the first magnetic shield structure and the second magnetic shield structure;

wherein the substrate comprises a plating layer on an inner wall of the via hole forming a plated via hole, the plating layer in electrical connection with the prefabricated ferromagnetic pin, the plating layer comprising an electrically conductive non-ferromagnetic material;

wherein the semiconductor package comprises a first amount of a ferromagnetic epoxy between the first portion of the prefabricated ferromagnetic pin and the first magnetic shield structure for attaching the first magnetic shield structure to the prefabricated ferromagnetic pin;

wherein the semiconductor package comprises a second amount of the ferromagnetic epoxy between the third portion of the prefabricated ferromagnetic pin and the second magnetic shield structure for attaching the second magnetic shield structure to the prefabricated ferromagnetic pin; and wherein the first amount of the ferromagnetic epoxy and the second amount of the ferromagnetic epoxy are configured to improve magnetic shielding performance of the first magnetic shield structure, the second magnetic shield structure and the prefabricated ferromagnetic pin.

14. The method according to claim 13, further comprising:

encapsulating a plurality of ferromagnetic pins comprising the prefabricated ferromagnetic pin and one or more further prefabricated ferromagnetic pins with a mold compound so that a part of each of the plurality of ferromagnetic pins is embedded in the mold compound; and inserting the plurality of ferromagnetic pins into a plurality of via holes comprising the via hole and one or more further via holes on the substrate after encapsulating the plurality of ferromagnetic pins with the mold compound.

15. The method according to claim 13, further comprising:

inserting a first portion of a further prefabricated ferromagnetic pin into a further via hole so that the first portion is held by the further via hole, with a second portion of the further prefabricated ferromagnetic pin extending out from the further via hole at the first surface of the substrate, and a third portion of the further prefabricated ferromagnetic pin extending out from the further via hole at the second surface of the substrate, wherein a further first magnetic shield structure is attached to or extended from the second portion of the further prefabricated ferromagnetic pin; and forming an insulator layer between the first magnetic shield structure and the further magnetic shield structure to form a capacitor.

16. The method according to claim 13, wherein the first magnetic structure and the prefabricated ferromagnetic pin are prefabricated as a whole.

* * * * *